United States Patent [19]
Thomas

[11] Patent Number: 6,158,502
[45] Date of Patent: *Dec. 12, 2000

[54] THIN PLANAR HEAT SPREADER

[75] Inventor: Daniel Lee Thomas, Incline Village, Nev.

[73] Assignee: Novel Concepts, Inc., San Francisco, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/992,889

[22] Filed: Dec. 18, 1997

Related U.S. Application Data

[63] Continuation-in-part of application No. 08/751,585, Nov. 18, 1996.

[51] Int. Cl.⁷ .................................................. F28D 15/00
[52] U.S. Cl. .................................. 165/104.26; 165/185
[58] Field of Search ................................. 165/185, 104.26, 165/104.14, 104.21, 133; 428/315.5; 361/700; 257/715

[56] References Cited

U.S. PATENT DOCUMENTS

| | | | |
|---|---|---|---|
| 3,906,604 | 9/1975 | Kakizaki et al. | 165/133 X |
| 4,015,659 | 4/1977 | Schladitz | 165/104.26 |
| 4,046,190 | 9/1977 | Marcus et al. | 165/104.26 |
| 4,047,198 | 9/1977 | Sekhon et al. | |
| 4,058,159 | 11/1977 | Del Bagno et al. | 165/104.26 |
| 4,118,756 | 10/1978 | Nelson et al. | 165/104.26 X |
| 4,322,737 | 3/1982 | Sliwa, Jr. | |
| 4,489,777 | 12/1984 | Iriarte | 165/104.26 |
| 4,550,774 | 11/1985 | Andres et al. | 165/104.14 X |
| 5,167,788 | 12/1992 | Hardee et al. | |
| 5,262,040 | 11/1993 | Hardee et al. | |
| 5,283,715 | 2/1994 | Carlsten et al. | |
| 5,355,942 | 10/1994 | Conte | |
| 5,366,598 | 11/1994 | Hardee et al. | |
| 5,409,055 | 4/1995 | Tanaka et al. | |
| 5,427,174 | 6/1995 | Lomolino, Sr. et al. | |
| 5,485,671 | 1/1996 | Larson et al. | |
| 5,545,262 | 8/1996 | Hardee et al. | |
| 5,642,775 | 7/1997 | Akachi | 165/104.21 X |
| 5,725,049 | 3/1998 | Swanson et al. | 165/104.26 |

FOREIGN PATENT DOCUMENTS

| | | |
|---|---|---|
| 31 17 758 A1 | 1/1982 | Germany . |
| 63-115351 | 9/1988 | Japan . |

*Primary Examiner*—Christopher Atkinson
*Attorney, Agent, or Firm*—William S. Galliani; Pennie & Edmonds LLP

[57] ABSTRACT

A heat spreading apparatus includes a body with an interior surface defining a void. The interior surface includes randomly configured high aspect ratio micro surface capillaries. Preferably, the micro surface capillaries are intergranular and intragranular capillaries that are less than 200 microns and have an aspect ratio of at least 1:1. All horizontal and vertical surfaces of the interior surface include the high aspect ratio micro surface capillaries. The high aspect ratio micro surface capillaries promote fluid transport and heat transfer.

21 Claims, 31 Drawing Sheets

THIN PLANAR HEAT SPREADER

This application is a continuation-in-part of Ser. No. 08/751,585, filed Nov. 18, 1996, entitled "Thin, Planar Heat Spreader".

BRIEF DESCRIPTION OF THE INVENTION

This invention relates generally to a heat distribution device, such as for use with a microprocessor or other microelectronic device. More particularly, this invention relates to a thin, planar heat spreader that distributes heat through the use of a planar capillary fluid path.

BACKGROUND OF THE INVENTION

Semiconductors are continuously diminishing in size. Corresponding to this size reduction is an increase in the power densities of semiconductors. This, in turn, creates heat proliferation problems which must be resolved because excessive heat will degrade semiconductor performance.

Heat pipes and thermosiphons have been used to cool semiconductors. Both heat pipes and thermosiphons operate on a closed two-phase cycle that utilizes the latent heat of vaporization to transfer heat.

Thermosiphons are typically implemented as a tube which encloses a fluid. When used in relation to a semiconductor, for instance a microprocessor, the first end of the thermosiphon, called a vaporizer or evaporator, is attached to a heat generating surface of the semiconductor. The second end of the thermosiphon, referred to as a condenser, vertically extends from the semiconductor where it is cooled by ambient air.

In a first cycle, the heat from the semiconductor vaporizes the fluid within the thermosiphon. During this vaporization process, the fluid vapor absorbs a quantity of heat called the latent heat of vaporization. The vapor formed in the vaporizer is at a higher temperature and hence higher pressure than the vapor at the condenser. Thus, the vapor flows from the evaporator to the condenser.

In a second cycle, the vapor condenses on the condenser walls of the thermosiphon. The condensation operation results in the release of heat. As a result, heat is moved from the evaporator to the condenser. Gravitational forces then cause the condensate in the condenser to flow back to the evaporator. The two-cycle process is then repeated.

Although the inside surface of a thermosiphon may occasionally be lined with grooves or a porous structure to promote the return of the condensate to the evaporator or increase the heat transfer coefficient, thermosiphons principally rely upon local gravitational force to return liquid to the evaporator. By definition, then, for proper operation, the evaporator of a thermosiphon must be located below the condenser.

Heat pipes operate on the same principle as thermosiphons. One distinguishing feature of heat pipes is that they utilize some sort of discrete wicking structure to promote the flow of liquid from the condenser to the evaporator. The wicking structure allows heat pipes to be used in a horizontal orientation relative to gravity, or even with the evaporator oriented against gravity, although the efficiency of the device varies greatly with different physical orientations. For example, if the device is oriented against gravity, its performance is reduced by approximately one-half Thus, it is the dependence of the local gravitational field to promote the flow of the liquid from the condenser to the evaporator that differentiates thermosiphons from heat pipes.

The problem with using thermosiphons with microprocessors is that thermosiphons require a vertical orientation with respect to gravity. This results in a high profile device. As a result, thermosiphons are difficult to use in compact electronic equipment such as palm, notebook, lap, desktop computers, and power supplies.

Another problem with the use of thermosiphons is that they are directionally sensitive. That is, they must be oriented such that gravity forces condensed fluid back to the evaporator. Microprocessor vendors do not know how a computer user will position a computer. For instance, some computers are placed horizontally on desk tops, while others are vertically mounted on floors. A thermosiphon can only operate with a single predetermined physical orientation to gravity.

While heat pipes are not as directionally sensitive, as thermosiphons, they still have the disadvantage of requiring a discrete wick structure. The discrete wick structure is typically formed of a screen, sintered metal, or as a set of axial grooves. A discrete wick structure adds manufacturing expense and otherwise mitigates against high volume manufacturing of heat pipes. In addition, a discrete wick structure, such as a screen, produces a relatively high hydrodynamic resistance. Thus, it would be highly desirable to provide a heat transfer device that is not directionally sensitive and does not require a high hydrodynamic resistance wick structure. Such a device should have a low vertical profile to insure that it can be readily incorporated into a variety of compact electronic equipment.

Another type of device that is commonly used to reduce the heat problems associated with semiconductors is a finned heat sink. A finned heat sink has a horizontal surface that is attached to a heat generating semiconductor surface and a set of fins vertically extending from the horizontal surface. The fins are cooled by ambient air. Thus, heat at the horizontal surface conductively migrates to the fins. Typically, heat is only generated in a few regions of the horizontal surface of a finned heat sink. Thus, only the fins corresponding to those few regions perform most of the cooling. To mitigate the problem of localized heat, a relatively thick heat slug can be used to improve heat distribution. The problem with this approach is that it substantially increases the vertical profile of the device. In addition, the heat slug is heavy and relatively expensive. Consequently, it would be highly desirable to provide a device that evenly distributes heat along the horizontal surface of a finned heat sink, without substantially increasing the vertical profile of the semiconductor package. Such a device would allow all of the fins of the heat sink to dissipate heat. Thus, the efficiency of the finned heat sink would be improved.

Fans have also been used to reduce the heat problems associated with heat generating surfaces, such as semiconductors. There is typically uneven heat distribution on the surface or surfaces from which a fan removes heat. A fan operating in these conditions is not as efficient as a fan removing heat from a surface with an even heat distribution. Moreover, when a fan is used on a heat generating surface, thermodynamic studies indicate that most air movement produced by the fan is applied at the perimeter of the fan. Thus, it is extremely important to convey heat to the perimeter of a heat generating surface. In view of the foregoing, it would be highly desirable to provide a device that evenly distributes heat to a surface or surfaces exposed to a fan. Optimally, such a device would have a low vertical profile to insure its compatibility with compact electronic equipment.

SUMMARY OF THE INVENTION

A heat spreading apparatus includes a body with an interior surface defining a void. The interior surface includes high aspect ratio micro surface capillaries in a random configuration. Preferably, the micro surface capillaries are intergranular and intragranular capillaries that are less than 200 microns and have an aspect ratio of at least 1:1. All horizontal and vertical surfaces of the interior surface include the high aspect ratio micro surface capillaries. The high aspect ratio micro surface capillaries promote fluid transport and heat transfer.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
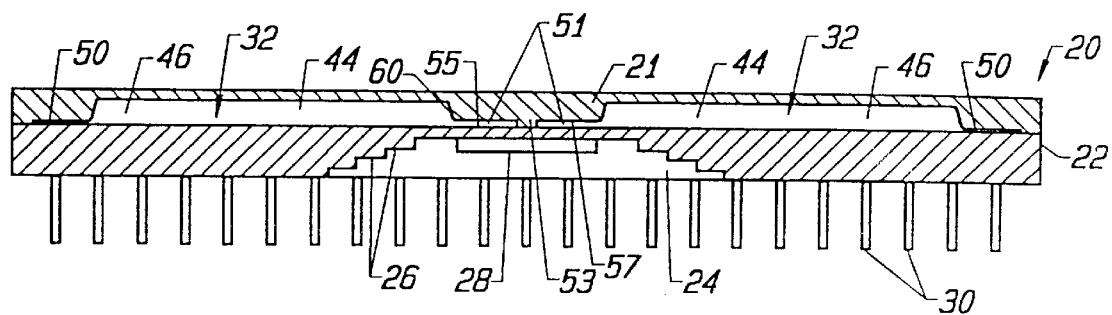
FIG. 1 is a cross-sectional view of a heat spreader formed in accordance with one embodiment of the invention.

FIG. 1 is a cross-sectional view of a heat spreader body 20 formed with a first planar body 22, in the form of a semiconductor package, and a second planar body 21, in the form of a lid. The semiconductor package 22 is a standard pin grid array package with a semiconductor void 24, which includes bond shelves 26. At the base of the semiconductor void 24 is a semiconductor 28. Bond wires (not shown) electrically couple the semiconductor 28 to the semiconductor package 22, which includes internal traces (not shown) with electrical connections to a set of package pins 30.

The lid 21 has a physical contour such that when it is attached to the semiconductor package 22 it defines a void with a non-capillary region 32. The non-capillary region 32 includes an adiabatic region 44 and a condenser 46. The void also includes a planar capillary fluid path 50, which includes an evaporator 51.

Heat produced by the semiconductor 28 migrates to the top of the semiconductor package 22. The generated heat is largely applied to the evaporator 51 of the heat spreader 20. Most of the heat is applied to the bottom surface 55 of the evaporator 51, some of the heat conducts through a heat transfer pillar 53 to heat the top surface 57 of the evaporator 51. Fluid within the evaporator 51 absorbs heat and vaporizes. The resultant vapor moves through the adiabatic region 44 where it does not loose or gain heat. It continues to move to the condenser region 46 where it cools and condenses on the interior walls of the device. The condensed liquid is then drawn, through capillary fluid action, into the planar capillary fluid path 50. That is, the small dimensions of the device, discussed in detail below, result in liquid being drawn by capillary action from the non-capillary region 32, in particular the condenser 46, into the planar capillary fluid path 50. The planar capillary fluid path 50 leads back to the evaporator 51. Thus, the two-phase vaporization-condensation cycle repeats itself. This cycle results in heat produced by the semiconductor 28 being distributed over a relatively large area, instead of being localized near the semiconductor 28.

Observe that the evaporator 51 generally corresponds to the size of the semiconductor 28. Similarly, the lid 21 generally corresponds to the size of the semiconductor package 22.

Figure 2:
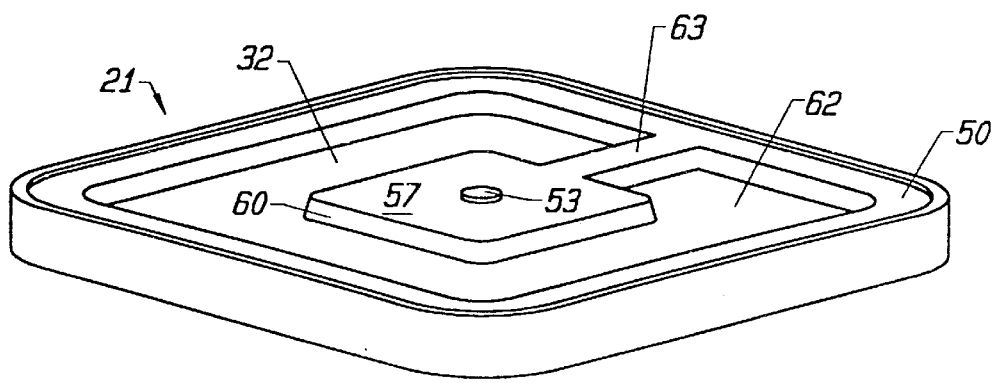
FIG. 2 is a perspective view of a portion of the heat spreader shown in FIG. 1.

The operation of the invention is more fully appreciated with reference to FIG. 2, which is a perspective view of the heat spreader lid 21. The figure illustrates a heat transfer pillar 53, which is formed on an evaporator surface 57 of an evaporator plateau 60. The evaporator plateau 60 rises from a non-capillary region surface 62. The planar capillary fluid path 50 is also formed above the non-capillary region surface 62. A fluid path bridge 63 links the planar capillary fluid path 50 with the evaporator plateau 60. Thus, the planar capillary fluid path 50 effectively includes the fluid path bridge 63 and the evaporator surface 57 of the evaporator plateau 60.

Those skilled in the art will recognize a number of unique attributes associated with the present invention. As indicated above, the dimensions of the device result in capillary action from the non-capillary region 32 to the planar capillary fluid path 50. This capillary action results regardless of the physical orientation of the device in relation to gravity. Thus, unlike a thermosiphon which must be used with a single orientation to gravity, the device of the invention is not limited in this manner.

The planar capillary fluid path 50 executes a wicking operation associated with heat pipes. However, unlike existing heat pipes, the wicking operation does not rely upon a separate structure, such as a screen. Instead, the planar capillary fluid path 50 is formed out of the body of the device. Thus, the expense associated with prior art heat pipes is avoided. In addition, the relatively high hydrodynamic resistance of a discrete wick structure is avoided.

Another advantage of the disclosed apparatus is that the circumferential motion of fluid in the fluid path 50 is never directly counteracted by the motion of vapor in the evaporator 51. In most heat pipes and thermosiphons, vapor moves one direction and liquid moves in an opposite direction. As a result, in these prior art devices a countercurrent viscous shear force exists between liquid flow and vapor flow, a problem avoided with the embodiment of FIG. 1.

As shown in FIG. 1, the size of the heat spreader 20 substantially conforms to the size of the semiconductor package 22 to which it is attached. This feature, coupled with the low vertical profile of the device makes it ideal for use with compact electronic equipment. The low vertical profile also makes the device ideal for use with other cooling devices, such as fans or finned heat sinks. As demonstrated below, the device of the invention is far more efficient at spreading heat than a solid metal slug of comparable dimensions.

The heat spreader lid 21 is preferably formed of metal, for example aluminum. The heat spreader lid 21 may be soldered or brazed to the semiconductor package 22. Preferably, the total vertical clearance of the heat spreader is approximately 2.0 millimeters, although the device has been implemented with a vertical clearance of 1.0 millimeters, and may be implemented with a vertical clearance of as much as 10.0 millimeters, after which size and weight considerations mitigate against a practical device.

The vertical clearance of the region defining the condenser 46 (and adiabatic region 44) is preferably less than 2.5 mm, preferably between and 2.0 mm and 0.5 mm, and most preferably approximately 1.25 mm. The vertical clearance of the region defining the evaporator and the planar capillary fluid path 50 is preferably less than 0.5 mm, preferably between 0.325 and 0.025 mm, most preferably approximately 0.125 mm.

The vertical clearance of the region defining the evaporator and the planar capillary fluid path 50 is relatively fixed, while the vertical clearance of the region defining the adiabatic region 44 and condenser 46 is extremely variable. The vertical clearance of the adiabatic region 44 is a function of the thermal performance (permissible pressure drop) required.

The geometry of the capillary fluid path 50 dictates the ability to supply fluid to the evaporator region. There is a limit to the amount of fluid any particular capillary geometry can supply, whereby beyond that limit "dry-out" occurs. Once the dry-out boundary is exceeded, an immediate and extreme thermal degradation is typically observed. On the other hand, the geometry of the adiabatic region 44 controls the efficiency of transferring the vapor from the evaporator region to the condenser region. The adiabatic geometry is not limited by some "cliff function", as in the case of the capillary fluid path. A small adiabatic region will still allow vapor flow, albeit with large resistance. Since the thermal efficiency (assuming adequate fluid supply) is a function of the pressure differential between the evaporator region and the condenser region, and the pressure differential is a function of velocity squared, and the velocity is directly proportional to the adiabatic region vertical clearance, the vertical clearance is adjusted to provide the thermal efficiency required. Thus, an adiabatic region with a vertical clearance of up to 9.0 millimeters is extremely efficient, but such a configuration requires the total vertical clearance for the heat spreader to be approximately 10.0 millimeters. As discussed above, sizes at or beyond this value become impractical.

The device of the invention may be formed by machining, by stamping, chemical etching, chemical depositing or any other technique known in the art. To insure proper wetting within the heat spreader 20, the surfaces within the body should be thoroughly cleaned. The two halves are preferably brazed. Thereafter, standard charging techniques are used to place the fluid within the body. Typically, a vacuum pump is then used to remove non-condensible gases from the void. Afterwards, only fluid exists in the void. At this point the pressure within the void is proportional to the vapor pressure of the fluid at the existing temperature. The body is then sealed to preserve conditions in the void.

Figure 3:
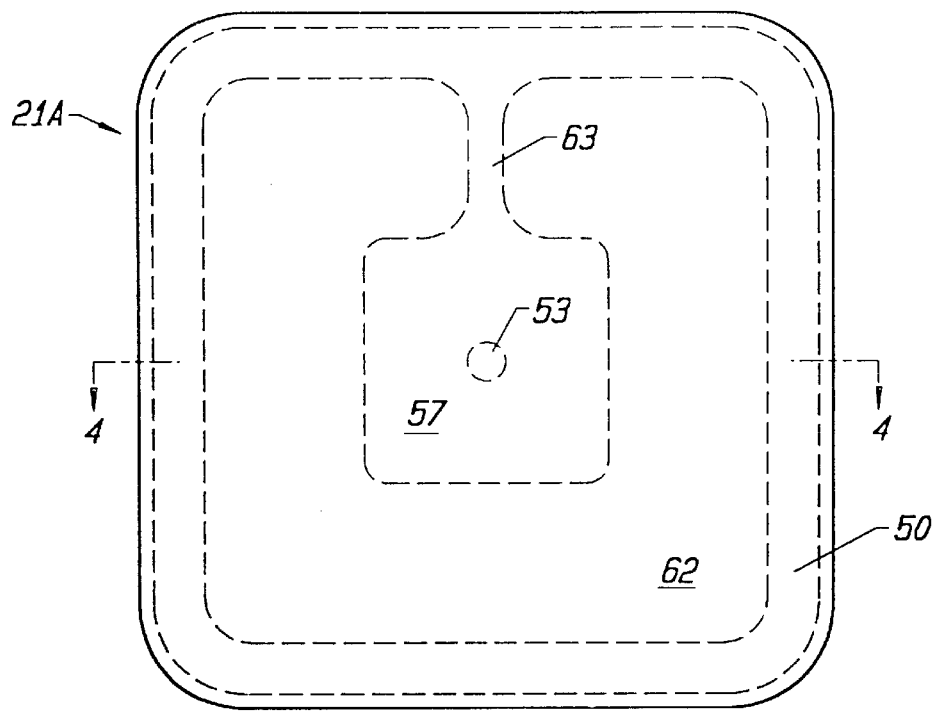
FIG. 3 is a top view of a portion of a heat spreader in accordance with an embodiment of the invention.

FIG. 3 is a top view of a heat spreader body portion 21A. The device of FIG. 3 is used with a corresponding heat spreader bottom to form a heat spreader in accordance with the invention. In such a configuration, both halves of the device are contoured, as opposed to the implementation of FIG. 1, where only one body portion of the device is contoured.

Figure 4:
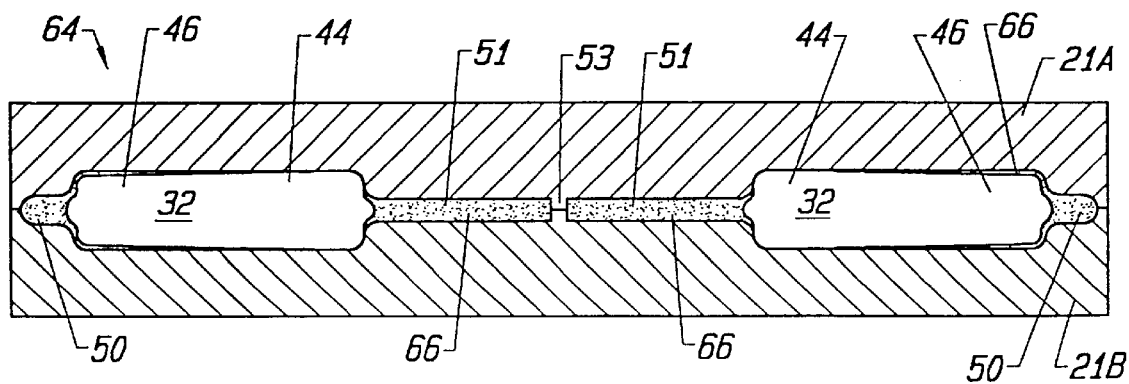
FIG. 4 is a cross-sectional view taken along the line 4—4 of FIG. 3, showing fluid within the heat spreader.

FIG. 4 illustrates a device 64 constructed with the heat spreader body portion 21A of FIG. 3. The device 64 includes a corresponding heat spreader bottom 21B. Thus, FIG. 4 can be interpreted as a cross-sectional view taken along the line 4—4 of FIG. 3.

FIG. 4 also illustrates fluid 66 positioned within the evaporator 51 and the fluid path 50. Further, the figure illustrates the fluid 66 wicking into the fluid path 50. The figure illustrates that there is very little fluid on the walls of the adiabatic region 44, and a small amount of fluid on the walls of the condenser 46.

Figure 4A:
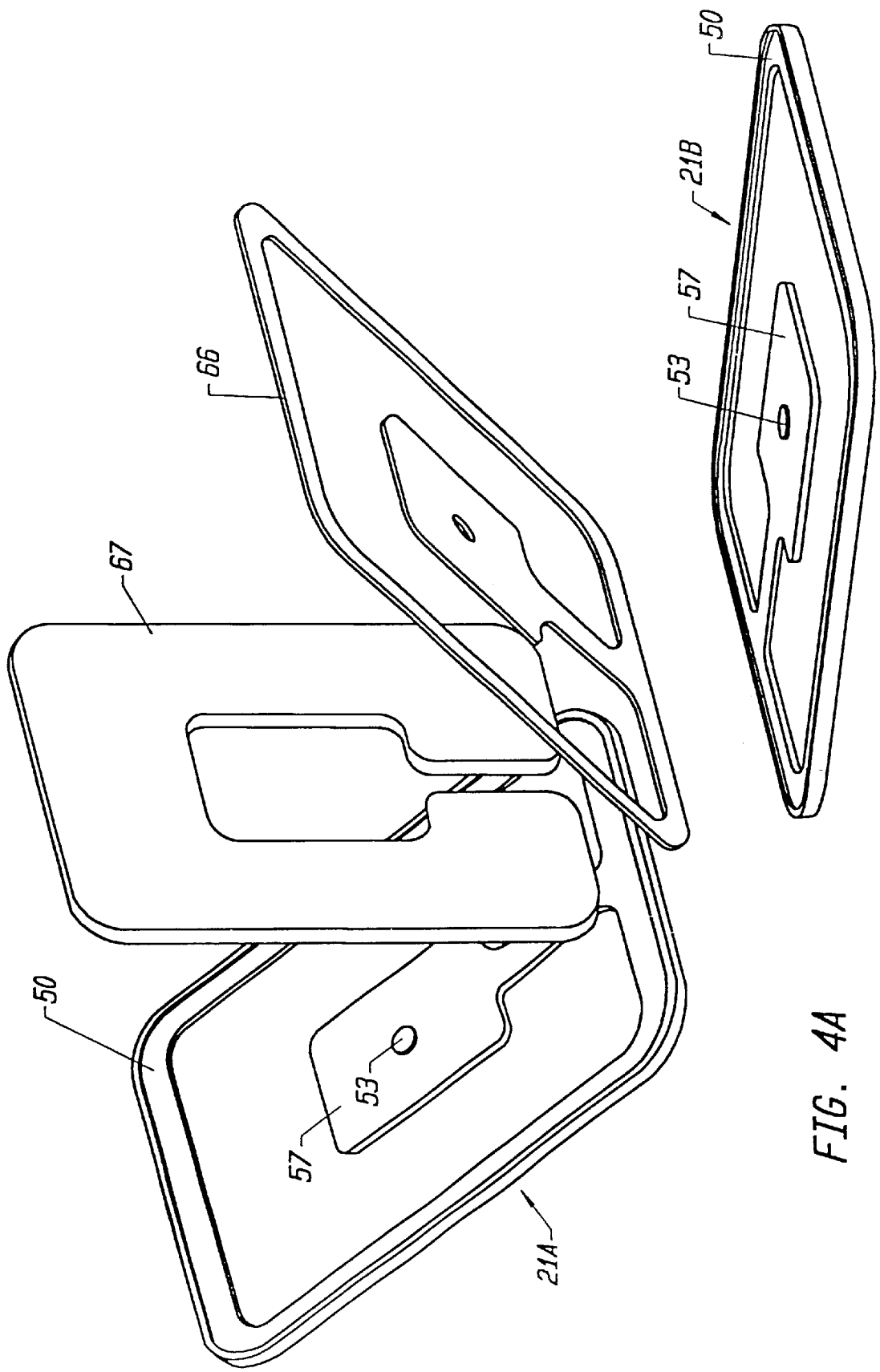
FIG. 4A is an exploded view of the apparatus of FIG. 4.

FIG. 4A is an exploded view of the device of FIG. 4. The figure illustrates the heat spreader top 21A and the heat spreader bottom 21B. The figure also illustrates that the fluid 66 fills the capillary fluid path 50. Thus, the shape of the fluid 66 is equivalent to the shape of the capillary fluid path 50. FIG. 4A also illustrates a spacial region 67. The spacial region 67 conforms to the shape of the non-capillary region 32. Thus, the spacial region 67 can be thought of as the area where vapor exists. As shown in FIG. 4 and as discussed below, in addition to vapor, some fluid does exist in the spacial region 67.

Figure 5:
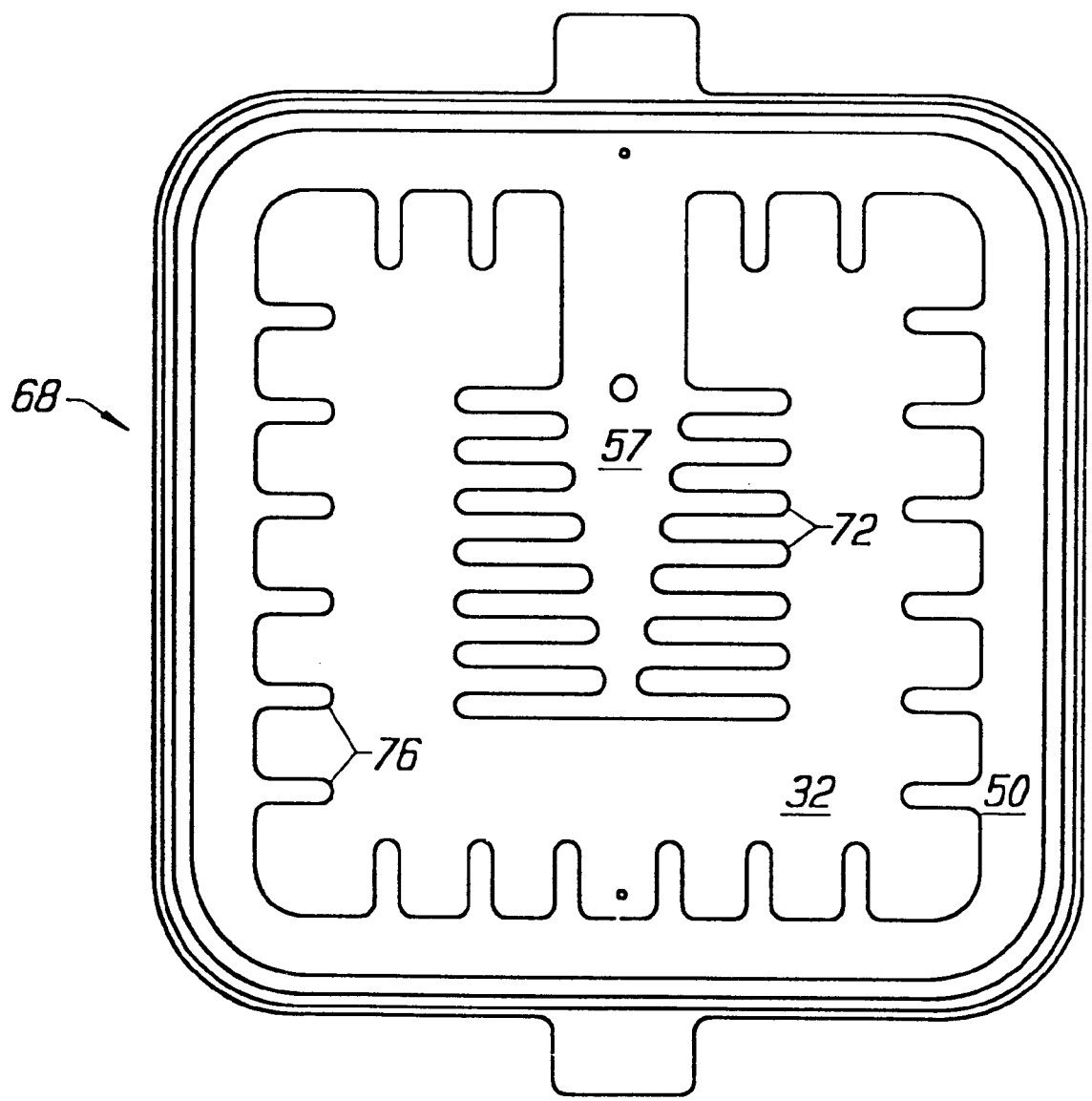
FIG. 5 is an alternate configuration of a portion of a heat spreader in accordance with an embodiment of the invention.

FIG. 5 is a top view of a heat spreader lid 68. The heat spreader lid 68 of FIG. 5 includes an evaporator surface 57 with extended edge surface elements 72. Since vapor typically leaves the evaporator surface 57 at an edge, the configuration of FIG. 5 provides an extended surface into the non-capillary region 32 to facilitate vapor entry. FIG. 5 also illustrates a capillary fluid path 50 with extended edge surface elements 76. The extended edge surface elements 76 facilitate the capillary movement of fluid from the non-capillary region 32 to the fluid path 50. A tapered surface between the extended edge surface elements 76 and the condenser non-capillary region 32 is preferable to facilitate capillary fluid movement. Preferably, all embodiments of the invention avoid abrupt surface transitions.

Figure 6:
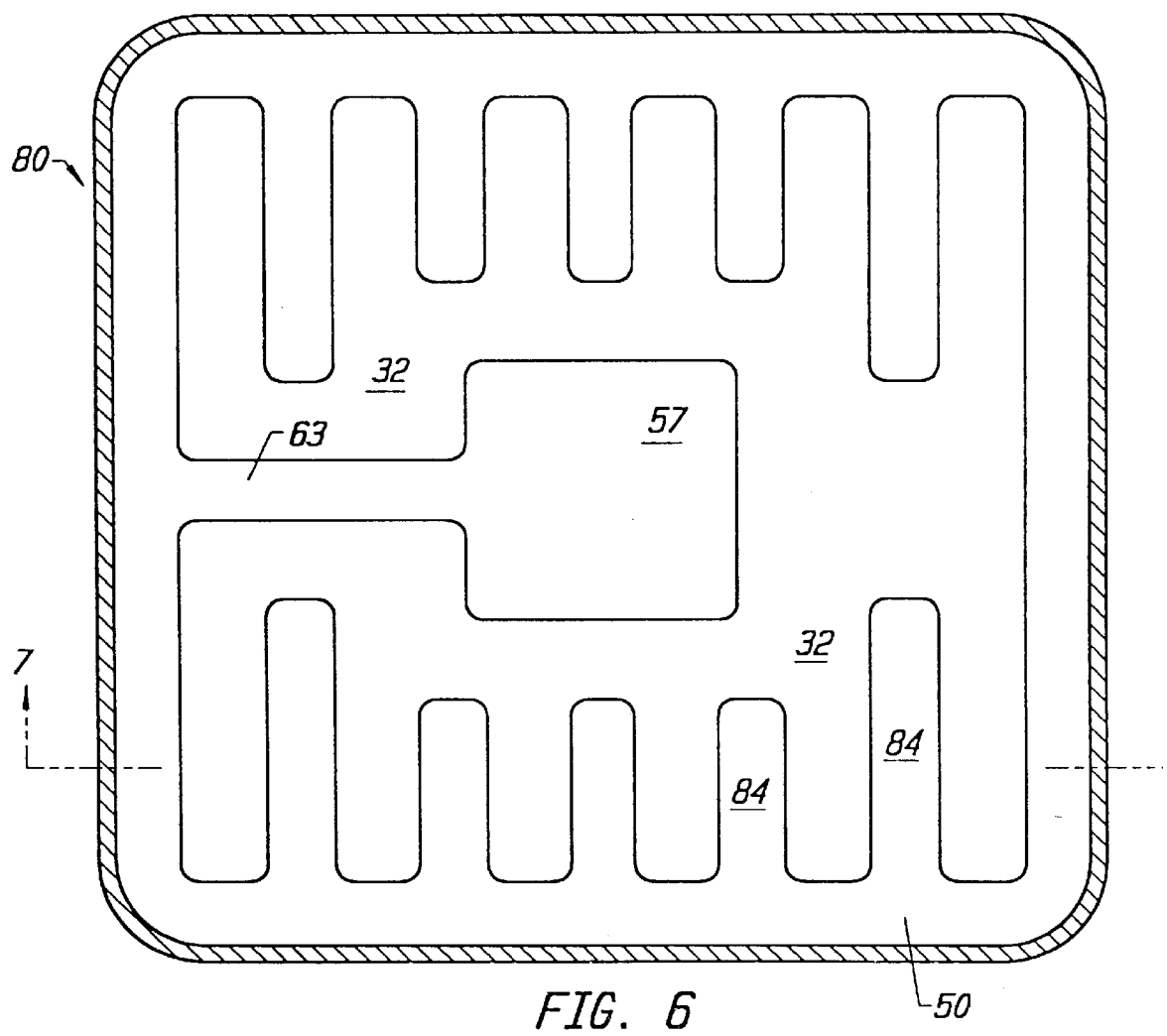
FIG. 6 is a top view of a heat spreader with an extended surface planar capillary fluid path, in accordance with one embodiment of the invention.

FIG. 6 illustrates an alternate heat spreader body 80 formed in accordance with the invention. The body 80 includes an evaporator plateau surface 57 connected to a fluid path bridge 63, which leads to a capillary fluid path 50. The capillary fluid path 50 includes extended surface elements in the form of peninsulas 84. The peninsulas 84 are larger than the extended surface elements 76 of FIG. 5, but they serve the same purpose of facilitating the capillary movement of fluid from the non-capillary region 32 to the capillary fluid path 50.

Figure 7:
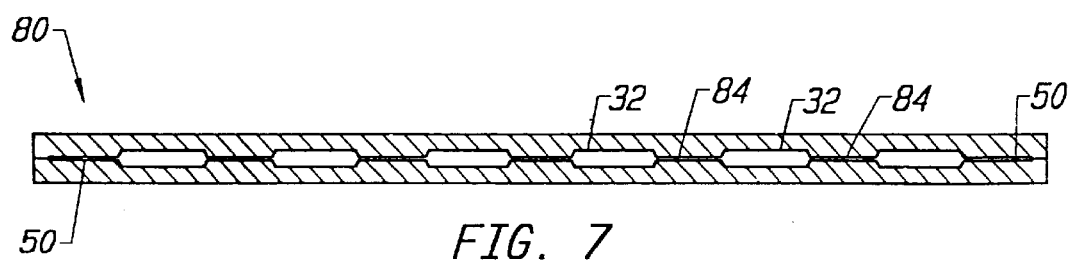
FIG. 7 is a cross-sectional view taken along the line 7—7 of FIG. 6.

FIG. 7 is a cross-sectional view of the device 80 taken along the line 7—7 of FIG. 6. The capillary path 50 may be observed on either end of the figure. The peninsulas 84 may also be observed between non-capillary regions 32.

Unlike the heat spreader lid 21 of FIG. 1, which forms a body with a semiconductor package, the device of FIGS. 6 and 7 is a discrete component. Preferably, the total vertical height of the device of FIG. 7 is less than 3.0 mm, preferably approximately 2.0 mm. The vertical height of the non-capillary region 32 is consistent with the previously described embodiment. Similarly, the vertical height associated with the path 50 is consistent with the previously described embodiment.

Figure 8:
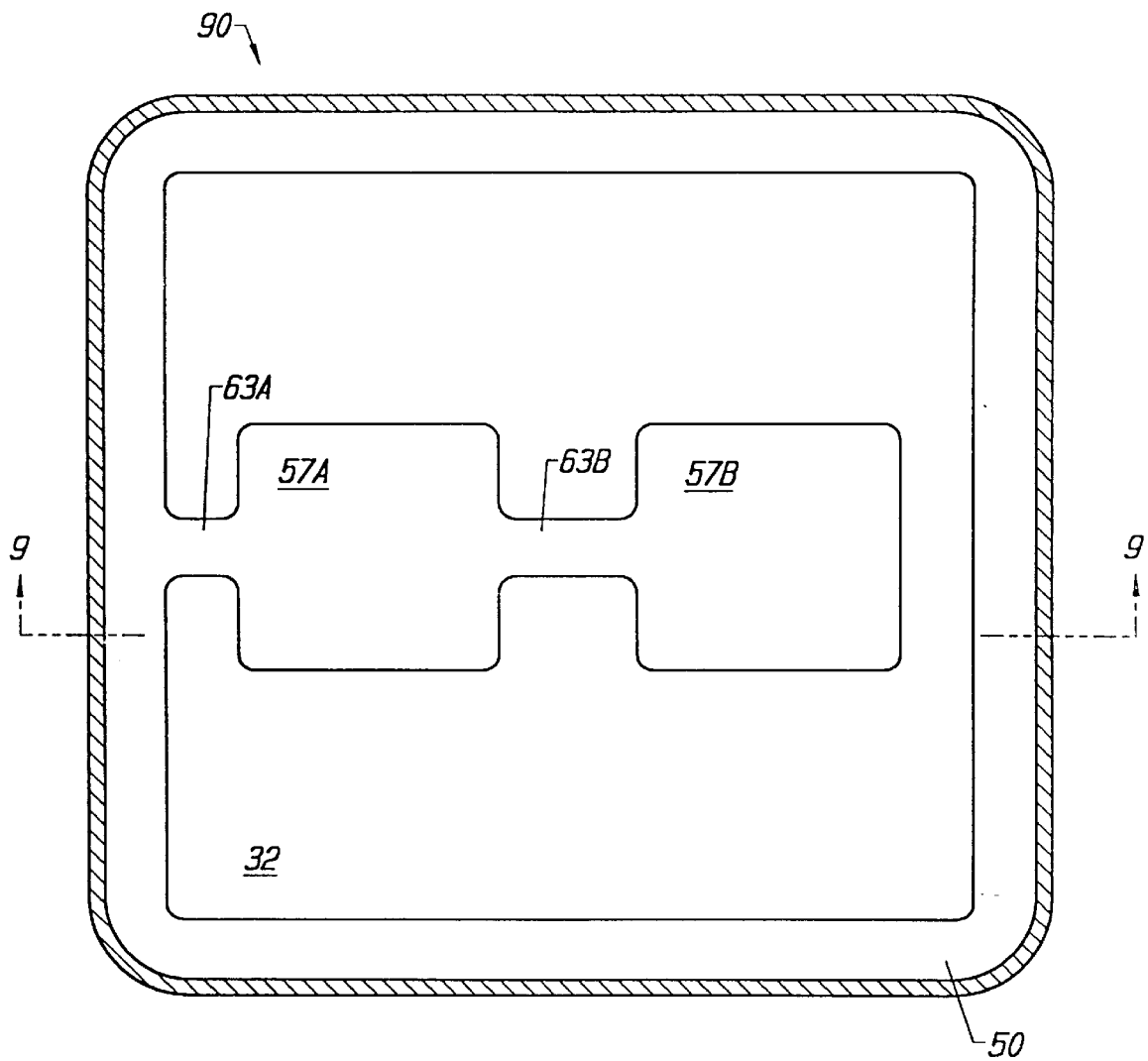
FIG. 8 is a top view of a dual heat source heat spreader body in accordance with another embodiment of the invention.

FIG. 8 is a top view of a dual heat source heat spreader body 90. The device 90 includes a first evaporator surface 57A and a second evaporator surface 57B. The first evaporator surface 57A is positioned over a first heat source, such as a semiconductor (not shown), while the second evaporator surface 57B is positioned over a second semiconductor (not shown). A first fluid path bridge 63A attaches the first evaporator surface 57A to the planar capillary fluid path 50, while a second fluid path bridge 63B attaches the first evaporator surface 57A to the second evaporator surface 57B. Preferably, a single non-capillary region 32 serves both evaporator regions defined by the evaporator surfaces 57A, 57B. In other words, the non-capillary region 32 has an open path between the two sides of the evaporator surfaces 57A, 57B.

Figure 9:
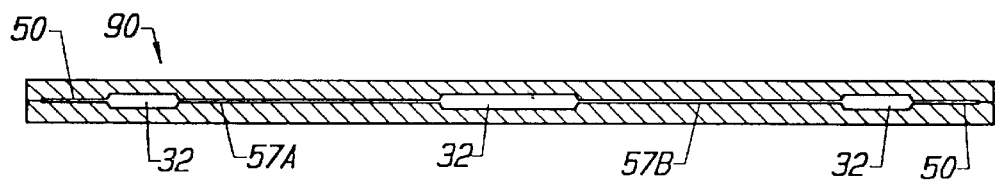
FIG. 9 is a cross-sectional view taken along the line 9—9 of FIG. 8.

FIG. 9 is a cross-sectional view taken along the line 9—9 of FIG. 8. FIG. 9 illustrates the planar capillary fluid path 50 at either end of the body 90. The figure also illustrates the first evaporator surface 57A positioned between non-capillary regions 32 and the second evaporator evaporator surface 57B positioned between non-capillary regions 32.

Figure 10:
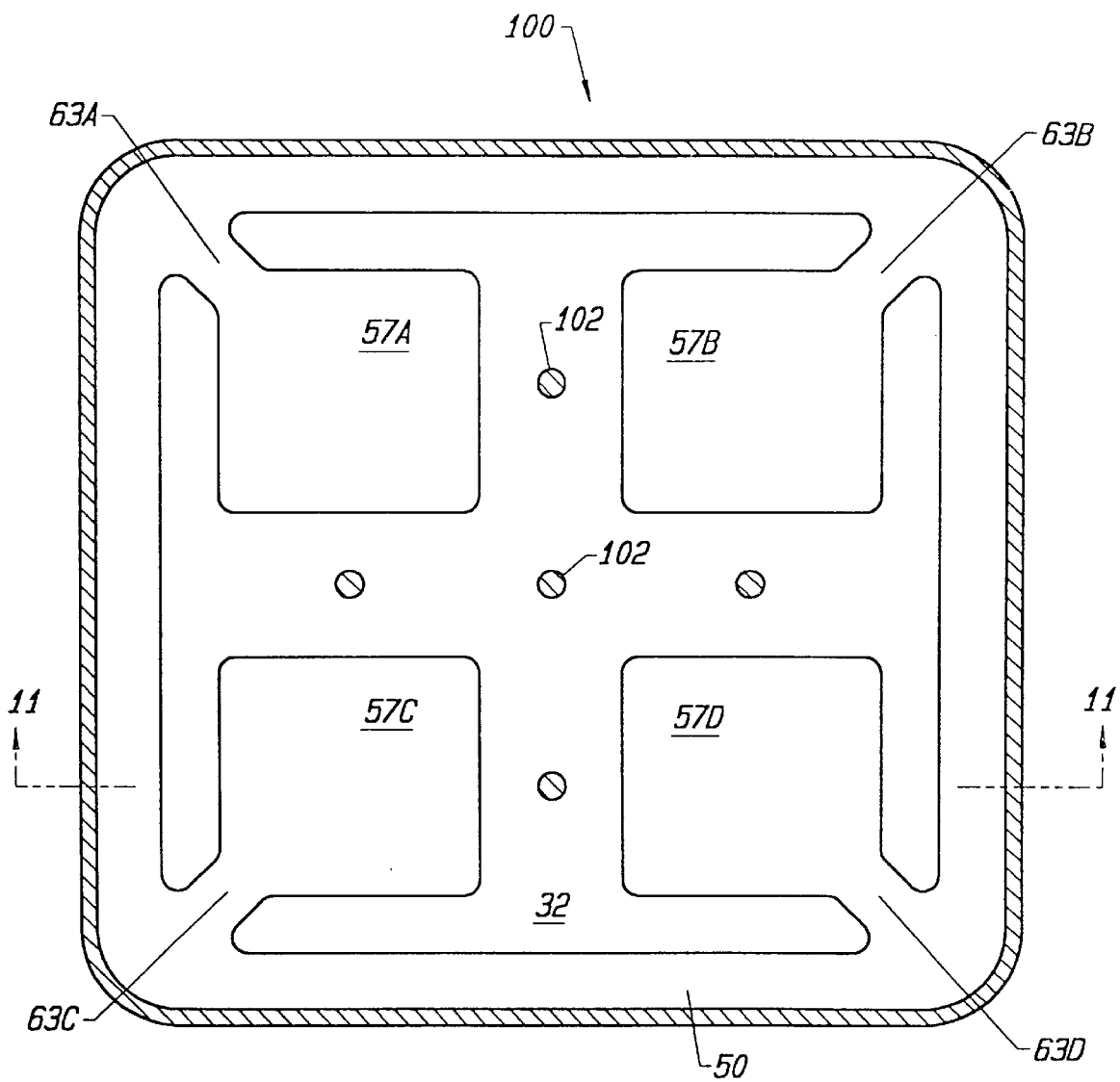
FIG. 10 is a top view of a quad heat source heat spreader body in accordance with another embodiment of the invention.

FIG. 10 illustrates a quad heat source heat spreader body 100. The body 100 is used in connection with a semiconductor package that houses four semiconductors. The body 100 includes a first evaporator surface 57A, a second evaporator surface 57B, a third evaporator surface 57C, and a fourth evaporator surface 57D. First, second, third, and fourth fluid path bridges 63A, 63B, 63C, and 63D are used to link the evaporator plateaus to the planar capillary fluid path 50. The non-capillary region 32 includes support pillars 102. The support pillars 102 operate as heat transfer pillars.

The support aspect of the pillars 102 is important to prevent collapse of the non-capillary region 32 under vacuum conditions.

Figure 11:
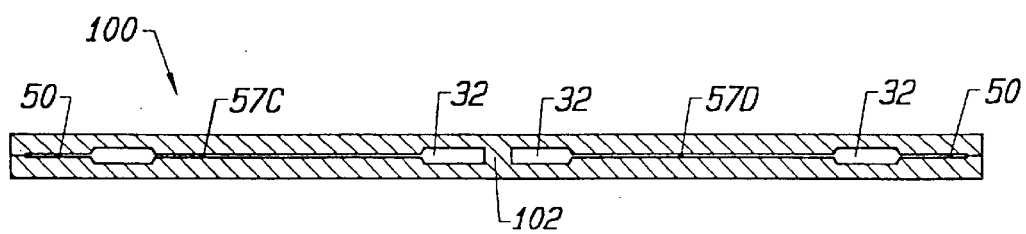
FIG. 11 is a cross-sectional view taken along the line 11—11 of FIG. 10.

FIG. 11 is a cross-sectional view taken along the line 11—11 of FIG. 10. The figure illustrates the planar capillary fluid path 50, the evaporator surfaces 57C and 57D, the non-capillary region 32, and the support pillar 102.

Figure 12:
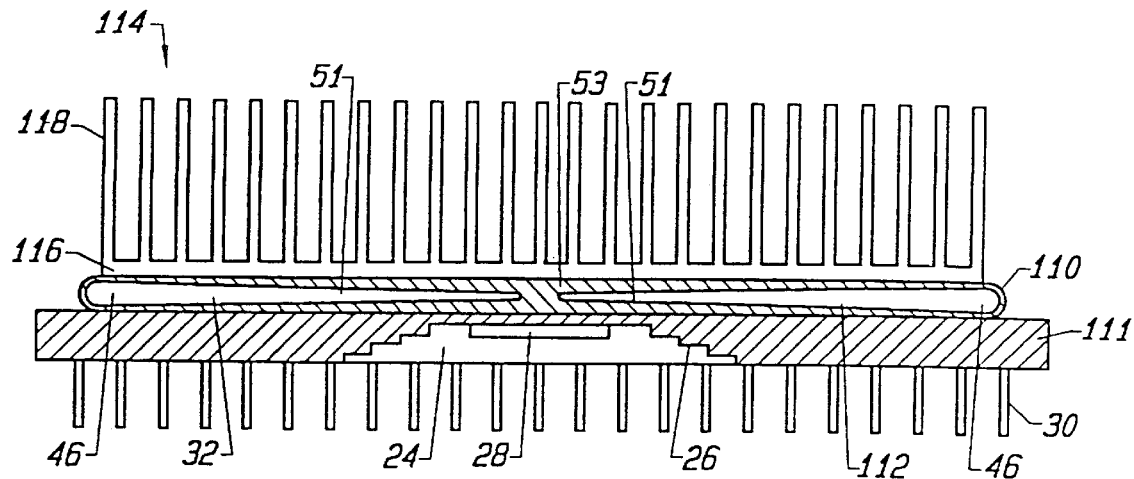
FIG. 12 is a cross-sectional view of an alternate heat spreader body configuration in accordance with the invention.

FIG. 12 is another embodiment of a heat spreader body 110 formed in accordance with the invention. The heat spreader body 110 is positioned on a semiconductor package 111. A finned heat sink 114 is positioned on the body 110. The finned heat sink 114 includes a horizontal surface 116 supporting vertical fins 118.

The heat spreader body 110 includes a sloping planar surface 112 extending from the evaporator 51 to the condenser 46 of the non-capillary region 32. The sloping planar surface 112 may be configured as a frustum of a cone. Liquid in the condenser 46 is drawn back to the evaporator 51 by the capillary action of the sloping planar surface 112. That is, capillary action draws fluid from the relatively large vertical clearance of the condenser 46 into the relatively small vertical clearance of the evaporator 51. Thus, this embodiment of the invention does not have a perimeter planar capillary fluid path. Instead, fluid is condensed in the non-capillary region 32 and is then drawn by capillarity into the evaporator 57, without the use of a fluid capillary path bridge. The advantage of this embodiment is that the fluid will be drawn into the evaporator 51 through multiple naturally-formed fluid capillary paths on surface 112.

Figure 13:
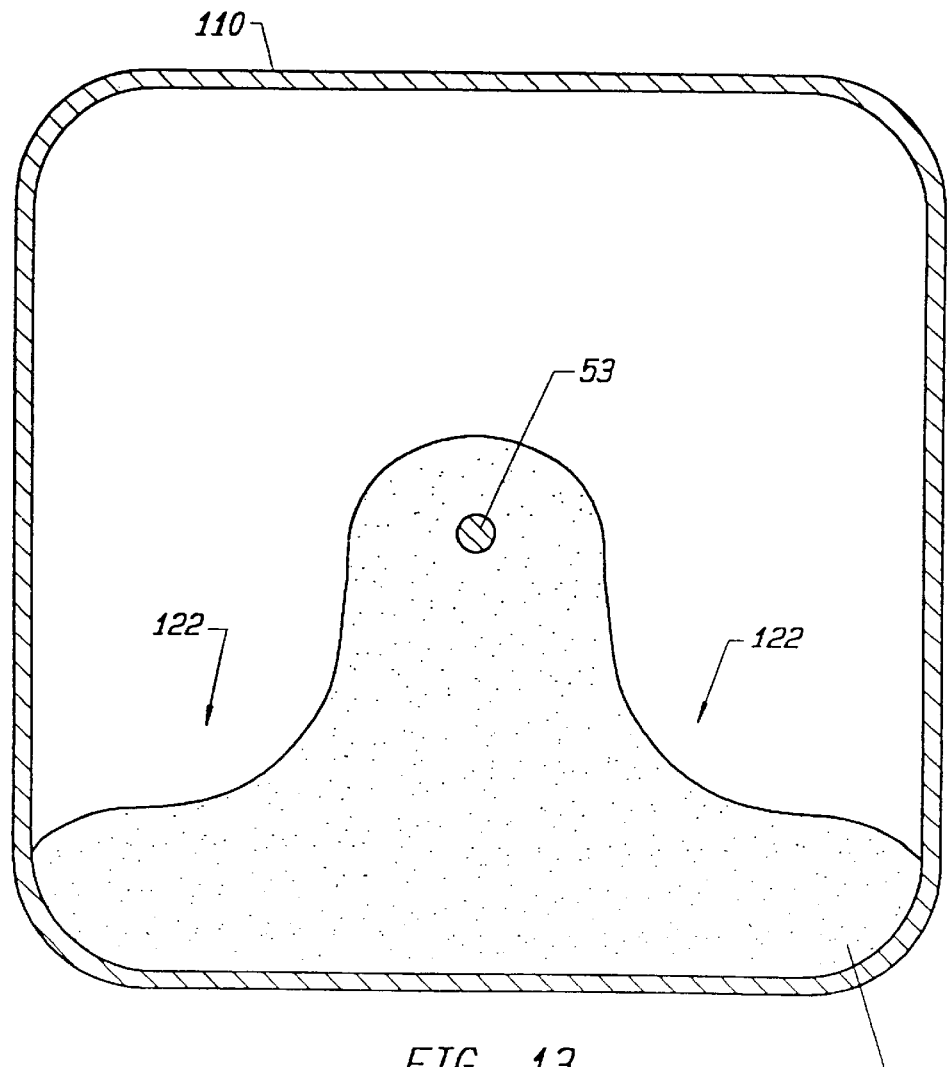
FIG. 13 illustrates the fluid pattern within the heat spreader body of FIG. 12 when it is vertically oriented with respect to gravity.

FIG. 13 illustrates the heat spreader body 110 of FIG. 12 in a vertical position with respect to gravity. The figure further illustrates the capillary action of a fluid within the body. Capillary action causes the fluid 120 to surround the heat transfer pillar 53. In addition, capillary action causes an upward extension of fluid 121 along the walls of the body 110, resulting in a concave fluid shape 122. FIG. 13 illustrates the directional insensitivity of the device of the invention, this feature is an important benefit of the invention.

Figure 14:
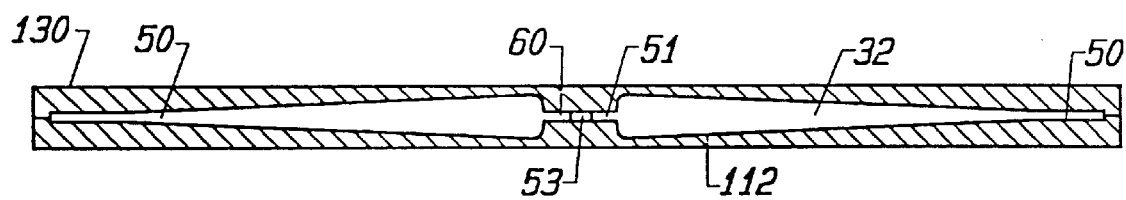
FIG. 14 is a cross-sectional view of an alternate heat spreader body configuration in accordance with the invention.

FIG. 14 is a cross-sectional view of still another heat spreader body 130 in accordance with the invention. In this embodiment, the sloping planar surface 112 results in a large vertical clearance at the non-capillary region 32, which is proximately positioned to the evaporator 51. The large vertical clearance at the non-capillary region 32 results in a relatively low vapor pressure adjacent to the evaporator 51 to facilitate the vaporization of fluid in the evaporator 51. The sloping planar surface 112 extends to a planar capillary fluid path 50 at the perimeter of the body 130. The shape of the planar capillary fluid path 50 is shown in FIG. 3. However, unlike the embodiment of FIG. 3, in the embodiment of FIG. 13, a gentle slope exists between the path 50 and the non-capillary region 32.

Figure 15:
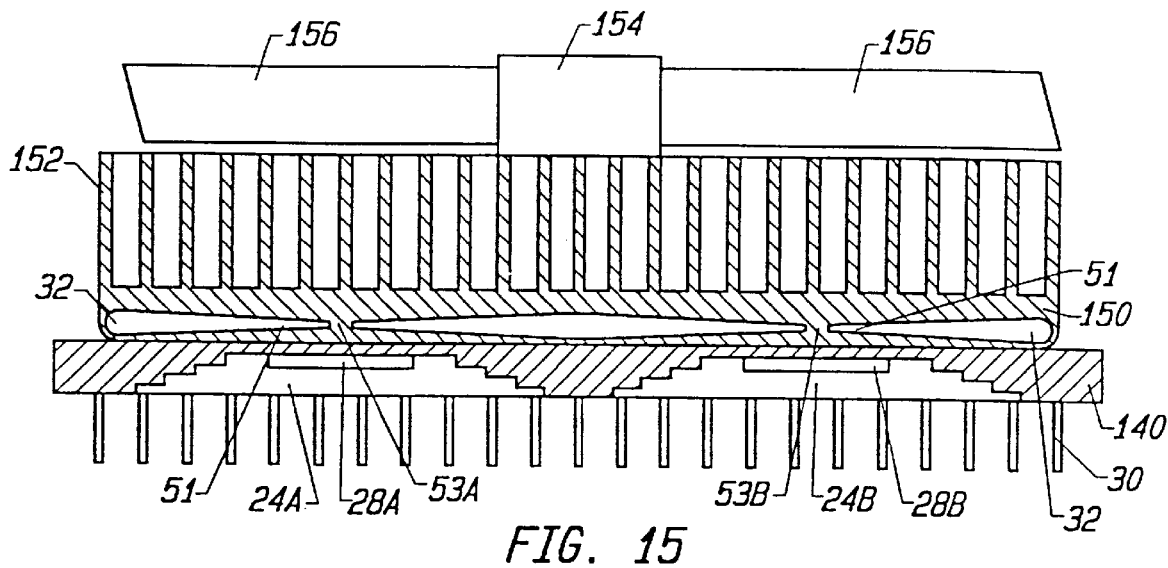
FIG. 15 is a cross-sectional view of an alternate dual heat source heat spreader body in accordance with the invention.

FIG. 15 is a cross-sectional view of a heat spreader body 150 that integrally incorporates heat sink fins 152. The heat spreader body 150 is for use with a multi-chip semiconductor package 140, which houses a first semiconductor 28A and a second semiconductor 28B. The body 150 includes a first heat transfer pillar 53A surrounded by an evaporator 51 and a non-capillary region 32. In addition, the body includes a second heat transfer pillar 53B surrounded by an evaporator 51 and a non-capillary region 32. Once again, a sloping surface is used between the evaporator 51 and the non-capillary region 32, and thereby enjoys the previously described advantages.

FIG. 15 further illustrates a fan 154, including fan blades 156, positioned on top of the heat sink fins 152. The positioning of a fan 154 on or within heat sink fins 152 is known in the art. The present invention facilitates this practice by providing a low vertical profile mechanism to distribute heat from the center of a semiconductor package to the edge of a semiconductor package where the fan performs the most active cooling.

Figure 16:
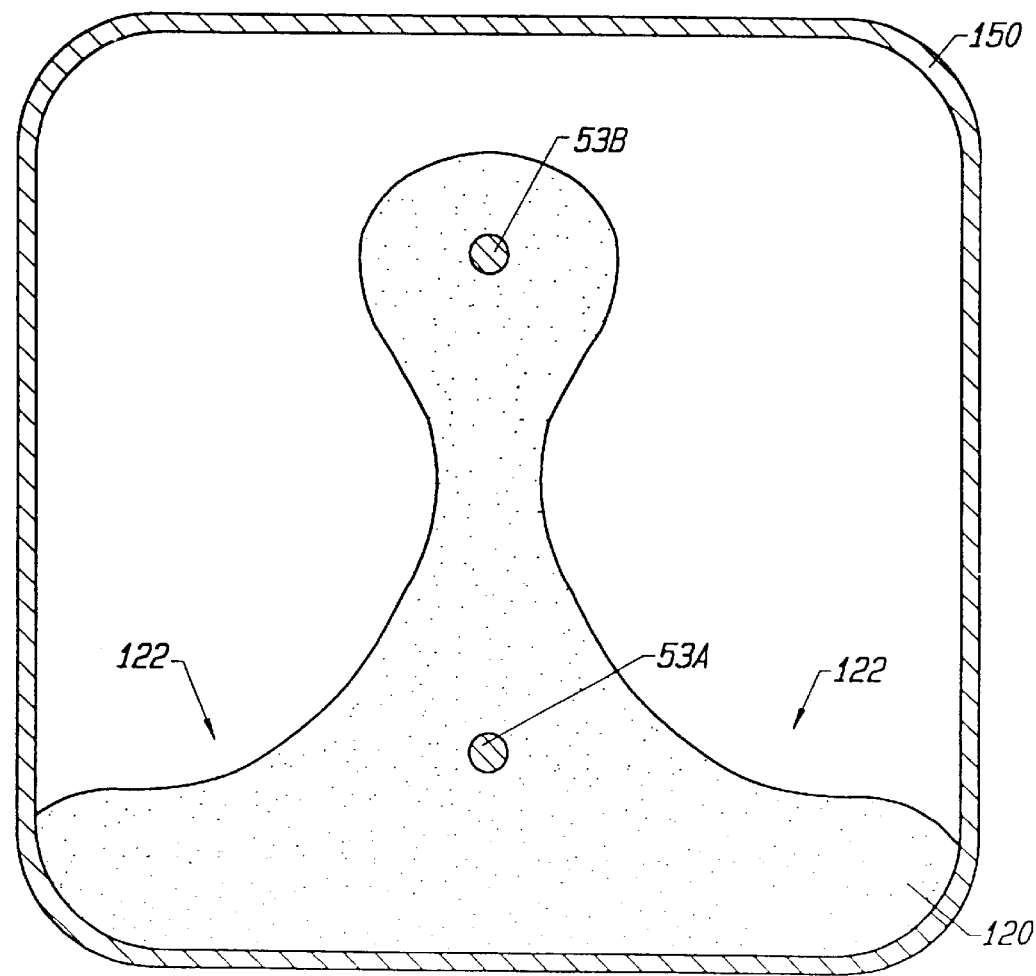
FIG. 16 illustrates the fluid pattern within the heat spreader body of FIG. 15 when it is vertically oriented with respect to gravity.

FIG. 16 illustrates the body 150 of FIG. 15 in a vertical position. The figure also illustrates the fluid within the body 150. Capillary action within the void of the body 150 causes fluid to surround the two heat transfer pillars 53A and 53B. As mentioned previously, when in a horizontal orientation to gravity, the capillary action toward the heat transfer pillars 53A and 53B will result in multiple natural capillary paths into the evaporator 51.

Figure 17:
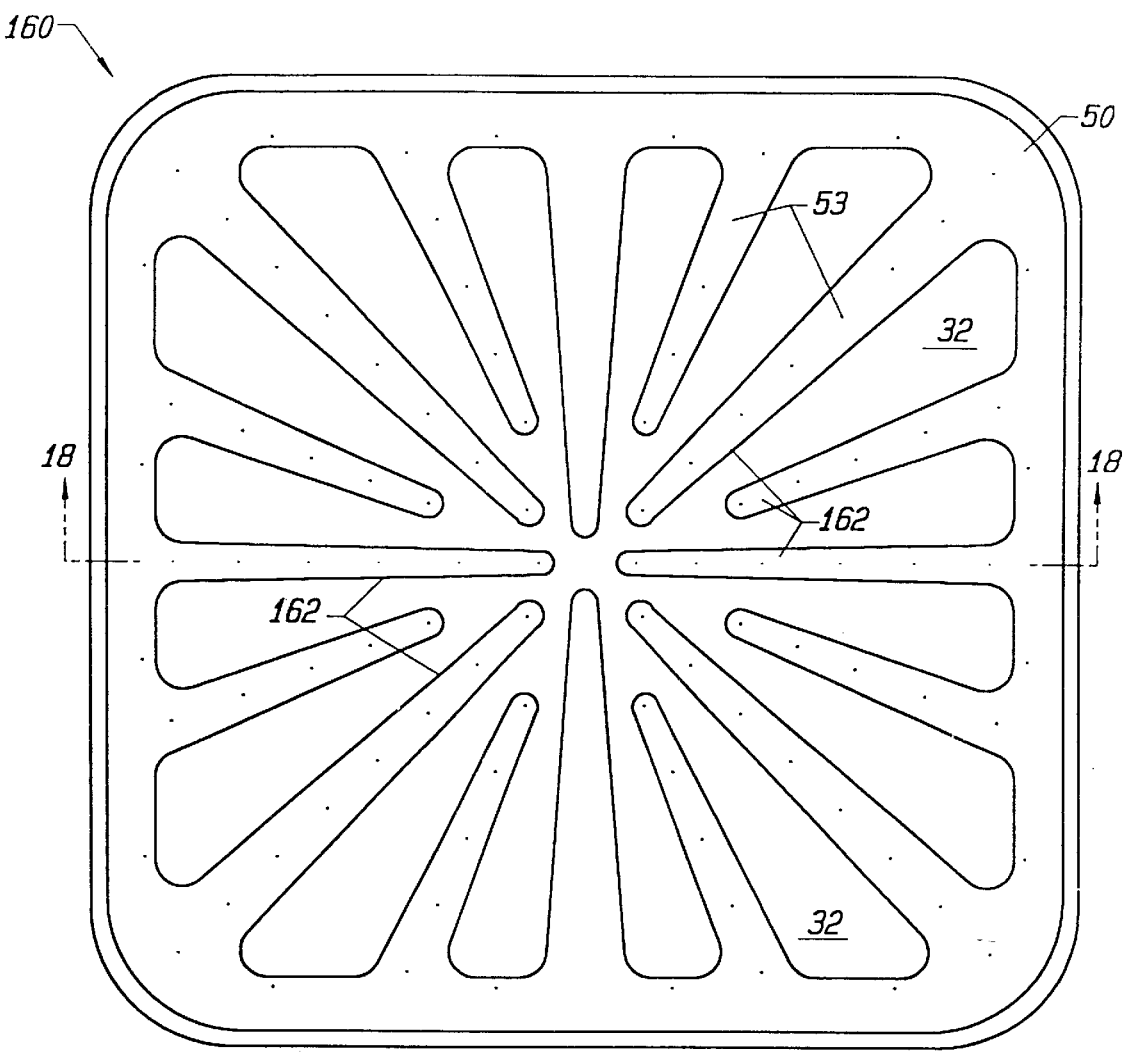
FIG. 17 is a top view of the bottom body portion of a "radial" heat spreader configuration in accordance with an embodiment of the invention.

FIG. 17 illustrates a "radial" heat spreader embodiment of the invention. The term "radial" refers to the contour of the non-capillary region 32, which exists at the center of the device and extends from the center in sixteen different directions, in a radial pattern. The fluid capillary path 50 exists on the perimeter of the device and extends to the center of the device with sixteen different legs 162. The advantages of this embodiment are the numerous fluid capillary path 50 and non-capillary region 32 edges and the fact that vapor can easily migrate to practically any region of the radial non-capillary region 32. Similarly, there are many fluid capillary path legs back to the center of the device.

Figure 18:
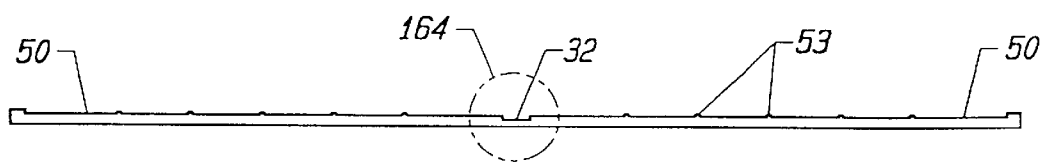
FIG. 18 is a cross-sectional view taken along the line 18—18 of FIG. 16.

FIG. 18 is a cross-sectional view of the device of FIG. 17 taken along the line 18—18. The figure shows the non-capillary region 32 at the center of the structure. Similarly, the figure shows two fluid capillary paths 50 extending into the non-capillary region 32. Liquid evaporates at the end of these fluid capillary paths 50 and enters the non-capillary region 32. Then, in most cases, the vapor migrates out to the perimeter regions of the non-capillary region 32. FIG. 18 also illustrates heat transfer pillars 53. As in previous embodiments, these pillars 53 also operate as support structures.

Figure 19:
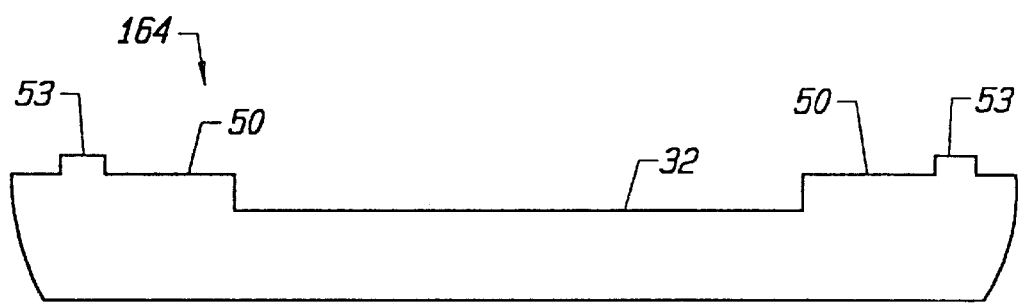
FIG. 19 is an enlarged view of a portion of the apparatus of FIG. 18.

FIG. 19 is an enlarged view of the center region 164 shown in FIG. 18. FIG. 19 illustrates the non-capillary region 32, the end of the fluid capillary paths 50, and the heat transfer pillars 53 positioned on the fluid capillary paths 50.

Figure 20:
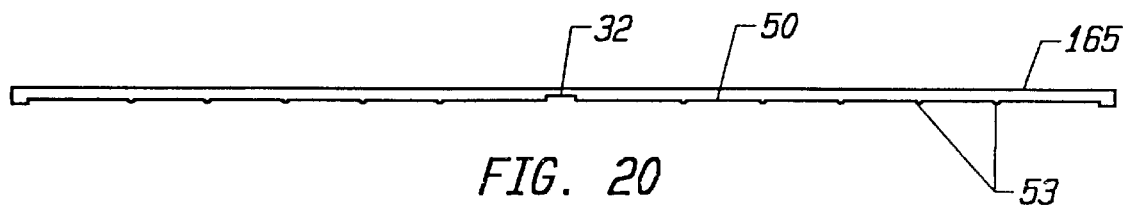
FIG. 20 is a side view of the top body portion to be used with the heat spreader of FIG. 19.

FIG. 20 is a side-view of a top body portion that is used for connection to the bottom body portion shown in FIG. 16. FIG. 20 illustrates a recessed region for forming the non-capillary region 32. In addition, the figure illustrates the ceiling portion of the fluid capillary paths 50 and heat transfer pillars 53, which are mated with the heat transfer pillars 53 shown in FIG. 18.

Figure 21:
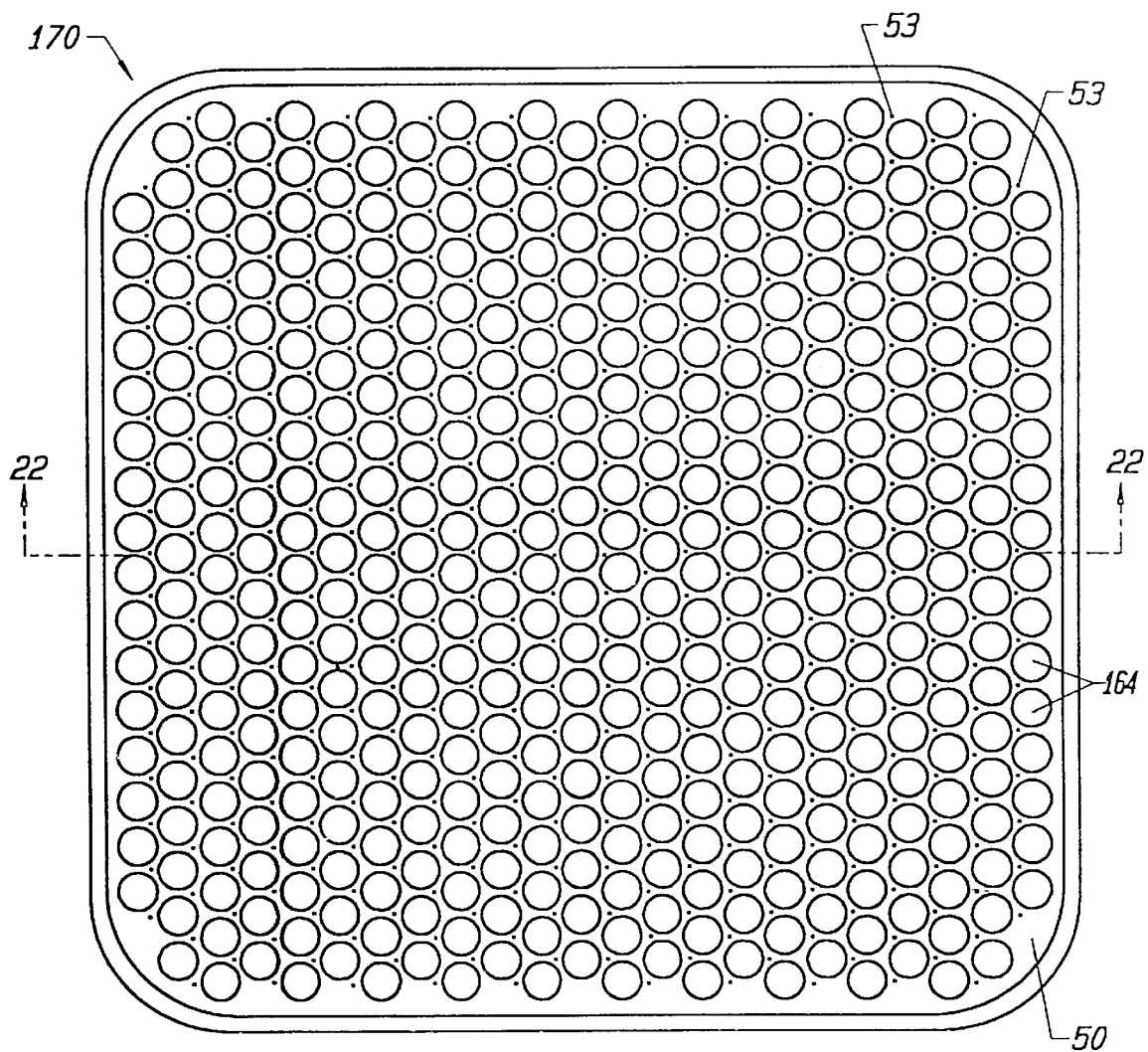
FIG. 21 is a top view of the bottom body portion of a "circle array" heat spreader configuration in accordance with an embodiment of the invention.

FIG. 21 is a top view of the bottom body portion of a "circle array" heat spreader apparatus 170 in accordance with an embodiment of the invention. In this configuration of the invention, the non-capillary region 32 is in the form of a large number of discrete circular wells 164. The fluid capillary path 50 surrounds each of the non-capillary regions 164. FIG. 21 also illustrates a large number of heat transfer pillars 53. This embodiment of the invention is advantageous because it allows fluid to easily migrate to almost any region of the structure. In addition, the embodiment provides a large number of edge surfaces for fluid to evaporate from the fluid capillary path 50 and to return to the fluid capillary path 50. Further, the structure has a "universal" configuration that is effective with a single chip package, a dual chip package, or any other type of multi-chip module.

Figure 22:
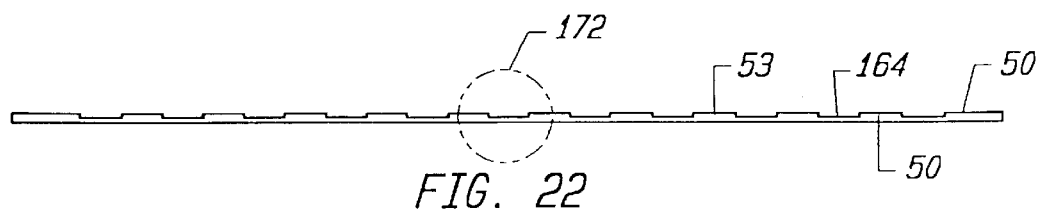
FIG. 22 is a cross-sectional view taken along the line 22—22 of FIG. 21.

FIG. 22 is a side view taken along the line 22—22 of FIG. 21. The figure shows different non-capillary regions 164 surrounded by segments of the fluid capillary path 50. The figure also illustrates heat transfer pillars 53 positioned in the fluid capillary path 50.

Figure 23:
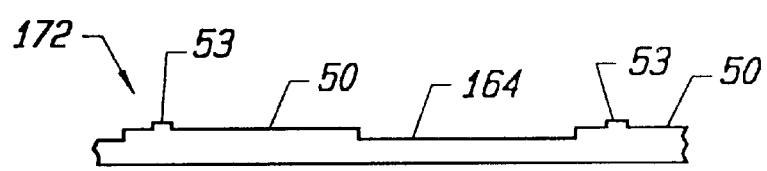
FIG. 23 is an enlarged view of a portion of the apparatus of FIG. 22.

FIG. 23 is an enlarged view of the region 172 of FIG. 22. FIG. 23 illustrates a non-capillary region 164 surrounded by a fluid capillary path 50, which includes heat transfer pillars 53.

Figure 24:
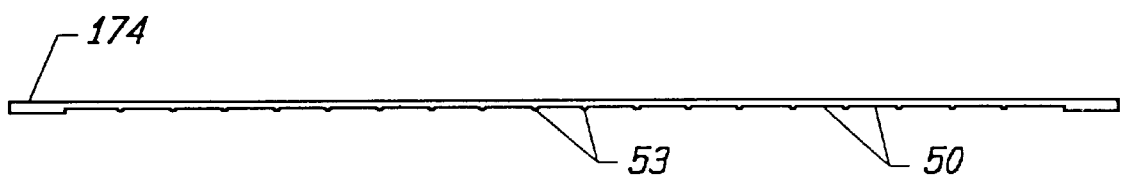
FIG. 24 is a side view of the top body portion to be used with the heat spreader of FIG. 21.

FIG. 24 is a top body portion 174 corresponding to the bottom body portion 170 of FIG. 21. The top body portion 174 is configured to mate with the bottom body portion 170. Thus, the top body portion 174 includes a fluid capillary path ceiling 50 with heat transfer pillars 53 for alignment with the same elements on the bottom body portion.

Figure 25:
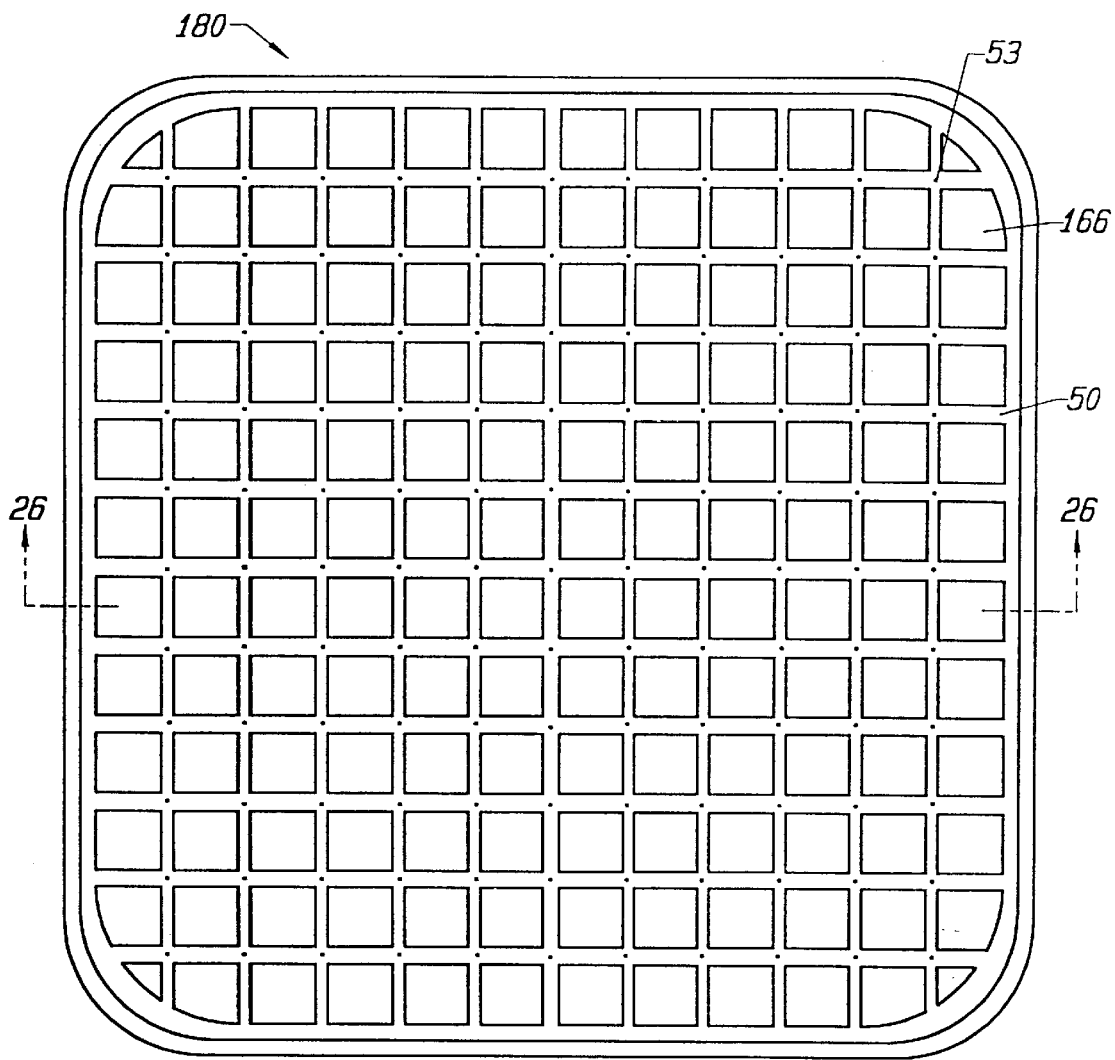
FIG. 25 is a top view of the bottom body portion of a "square matrix" heat spreader configuration in accordance with an embodiment of the invention.

FIG. 25 is a top view of the bottom body portion of a "square matrix" heat spreader apparatus 180 in accordance with an embodiment of the invention. In this embodiment, the fluid capillary path 50 is shaped like a grid and discrete square non-capillary regions 166 punctuate the grid. The embodiment also includes heat transfer pillars 53.

Figure 26:
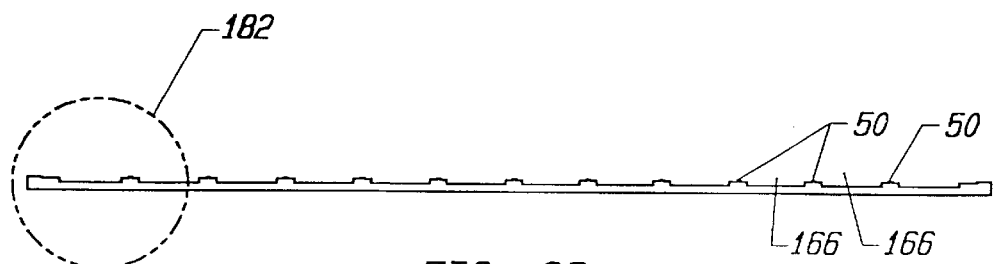
FIG. 26 is a cross-sectional view taken along the line 26—26 of FIG. 25.
Figure 27:
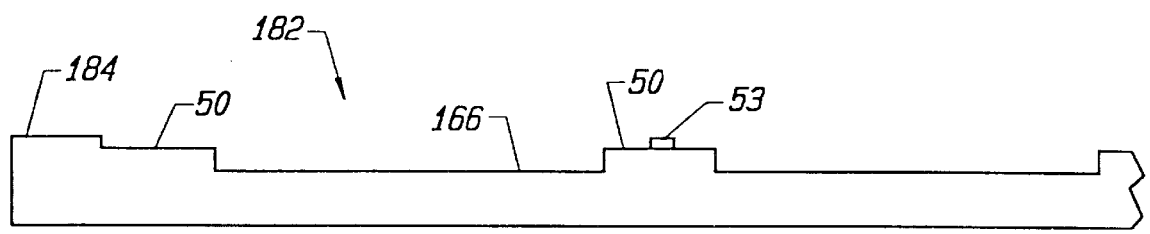
FIG. 27 is an enlarged view of a portion of the apparatus of FIG. 26.

FIG. 26 is a side view of the apparatus 180 taken along the line 26—26 of FIG. 25. The figure illustrates the fluid capillary path 50 surrounding different non-capillary regions 166. FIG. 27 is an enlarged view of the region 182 of FIG. 26. FIG. 27 illustrates fluid capillary paths 50 surrounding a non-capillary region 166. The figure also illustrates a heat transfer pillar 53. A perimeter plateau 184 for connection with a lid is also illustrated.

Figure 28:
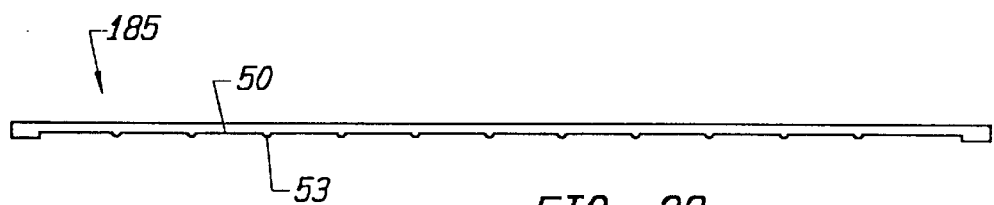
FIG. 28 is a side view of the top body portion to be used with the heat spreader of FIG. 24.

FIG. 28 illustrates a lid 185 for attachment to the apparatus 180 of FIG. 25. The lid 185 includes a fluid capillary path lid portion 50 with heat transfer pillars 53, which mate with the heat transfer pillars 53 of FIG. 25.

An advantage of the embodiment of the invention illustrated in FIGS. 25–28 is the ability of fluid to move in linear paths across the entire surface area of the device. In addition, the square configuration provides a relatively large amount of edge area for evaporated fluid to escape the fluid capillary path 50 and for condensed fluid to return to the fluid capillary path 50. Further, as in the case of the "circular array" configuration of FIGS. 21–24, the device of FIGS. 25–28 has a universal configuration that allows it to be effectively used with a variety of heat source distribution schemes.

Figure 29:
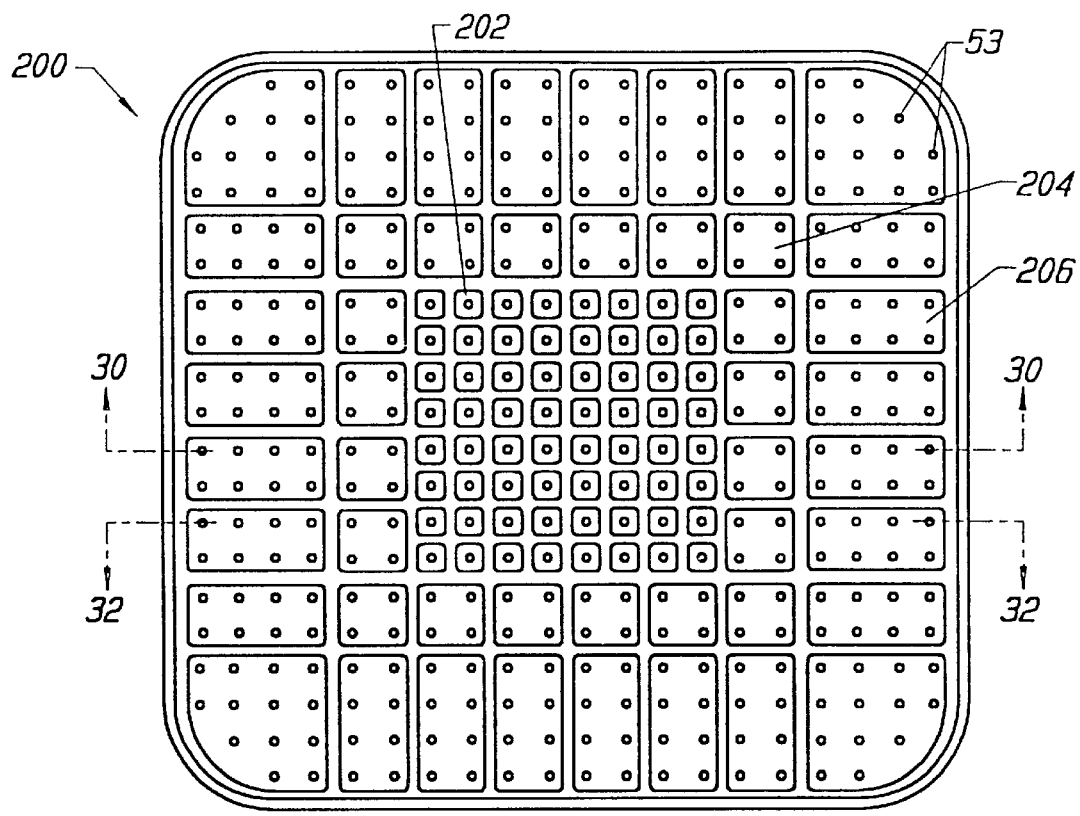
FIG. 29 is a top view of the bottom body portion of a "varying size square matrix" heat spreader configuration in accordance with an embodiment of the invention.

FIG. 29 illustrates another heat spreader 200 in accordance with the invention. The heat spreader 200 includes non-capillary regions of varying size. In particular, the figure illustrates small patterned non-capillary regions 202, larger patterned non-capillary regions 204, and still larger patterned non-capillary regions 206. The patterned non-capillary regions are generally square in FIG. 29, but other patterns, such as circles or triangles may also be used.

Figure 30:
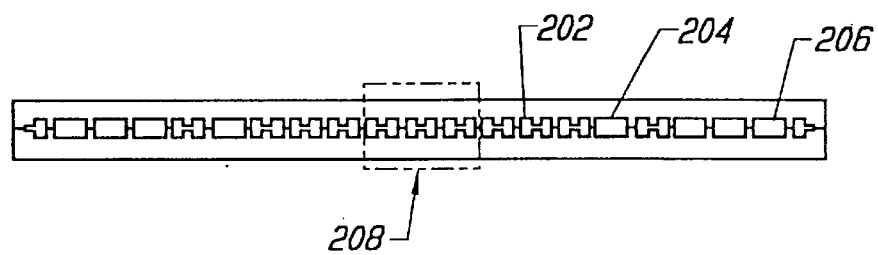
FIG. 30 is a cross-sectional view taken along the line 30—30 of FIG. 29.

FIG. 30 is a cross-sectional view taken along the line 30—30 of FIG. 29. The figure illustrates non-capillary regions 202–206 of varying sizes. Heat transfer pillars interrupt the different non-capillary regions so the different non-capillary regions are somewhat difficult to identify. This effect is more fully appreciated with reference to FIG. 31.

Figure 31:
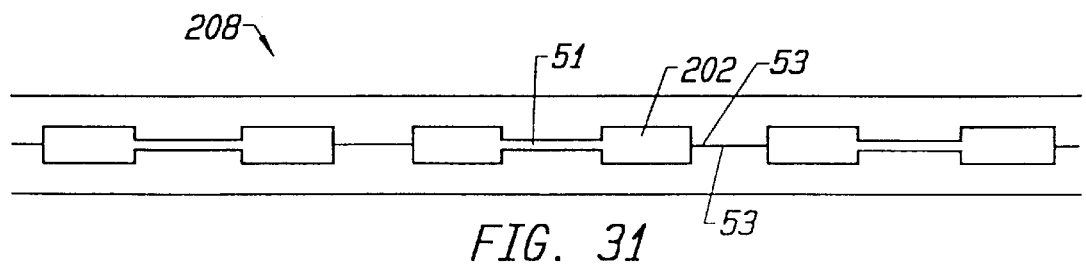
FIG. 31 is an enlarged view of a portion of the apparatus of FIG. 30.

FIG. 31 is an enlarged view of the region 208 of FIG. 30. FIG. 31 illustrates that corresponding heat transfer pillars 53 from two sides of the body meet to form a continuous pillar structure. In addition to providing physical support for the device and operating to conductively move heat from one side of the device to the other, these pillars are useful as condensing surfaces. In other words, they are useful to form additional condensing area for vaporized fluid. A contoured surface in the non-capillary regions may also be used to provide additional condensing area for the vaporized fluid.

Figure 32:
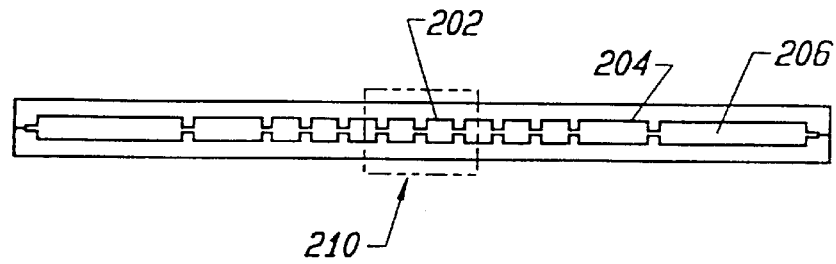
FIG. 32 is a cross-sectional view taken along the line 32—32 of FIG. 29.

FIG. 32 is a cross-sectional view taken along the line 32—32 of FIG. 29. The figure illustrates non-capillary regions 202–206 of varying size. Note that in this figure the different non-capillary regions are not divided-up by heat transfer pillars 53.

Figure 33:
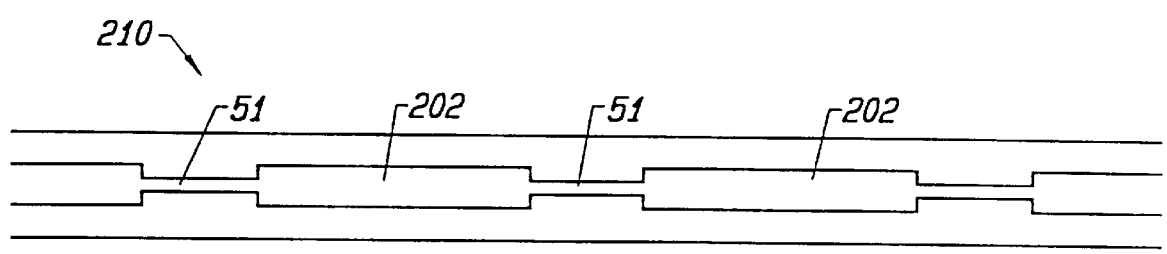
FIG. 33 is an enlarged view of a portion of the apparatus of FIG. 32.

FIG. 33 is an enlarged view of the region 210 of FIG. 32. FIG. 33 illustrates evaporator regions 51 formed between non-capillary regions 202. Observe once again that this figure is taken along a line that does not include heat transfer pillars 53.

Figure 34:
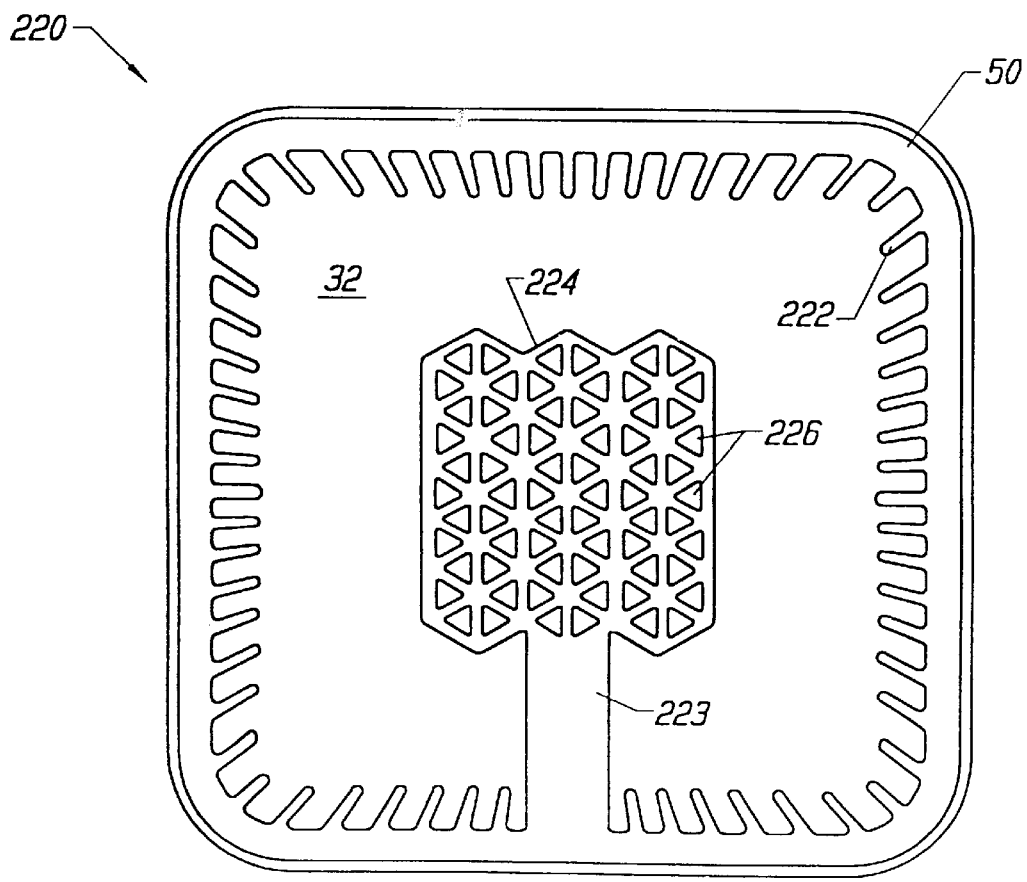
FIG. 34 is an alternate embodiment of the invention which includes an evaporator plateau with triangular condenser regions formed therein.

FIG. 34 illustrates another heat spreader 220 in accordance with the invention. The heat spreader 220 includes a non-capillary region 32 surrounded by a capillary fluid path 50. The capillary fluid path 50 includes extended surface elements 222. The capillary fluid path 50 leads to a capillary fluid path bridge 223, which terminates in an evaporator plateau 224. The evaporator plateau 224 has a set of non-capillary regions 226. In this embodiment, each non-capillary region 226 is in the form of a triangle. FIG. 34 illustrates that different implementations of the disclosed invention may be combined to construct an optimal device for a particular application.

Figure 35:
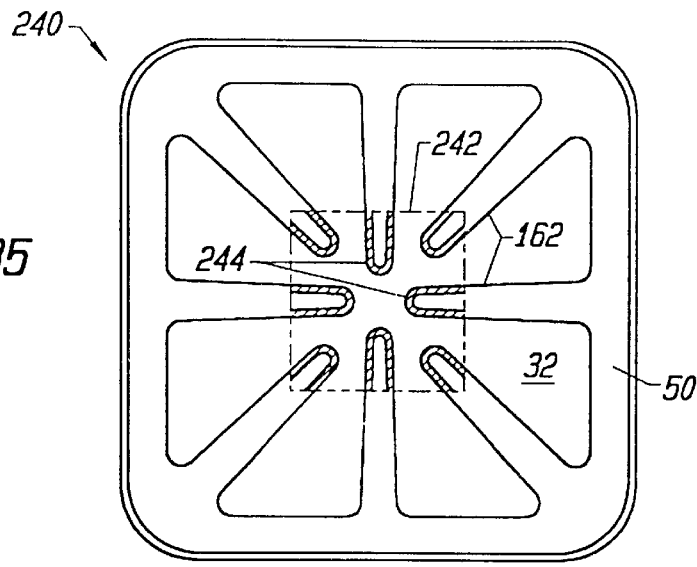
FIG. 35 is a plan view of an embodiment of the invention which includes perimeter nucleation site surfaces in selected regions of the capillary fluid path.

FIG. 35 is a plan view of another embodiment of the invention. The device 240 of FIG. 35 generally corresponds to the device 160 of FIG. 17. However, in FIG. 35, the edges 244 of the capillary fluid path 50 in a heat generating region 242 are treated surfaces. As used herein, a treated surface is a surface whose characteristics have been modified, for example, to include nucleation sites for the promotion of boiling, to include a coating for enhancing fluid wettability, to include a coating for surface passivation (rendering the wetted surface passive to oxidation or chemical attack from the fluid), or to include micro surface fissures for enhanced capillary flow. Micro surface fissures lessen the abrupt boundary between the capillary fluid path and the non-capillary region (the adiabatic and condenser regions). Micro fissures in the adiabatic surface near the evaporator region will cause fluid to migrate from the fluid capillary path to the micro fissures by the previously described capillary physics. This fluid will evaporate, thereby extending the evaporation (cooling) area. The micro fissures in the adiabatic surface near the condenser region aid in returning condensed fluid to the capillary fluid path. This results in a thinner liquid layer on the adiabatic surface, reducing the thermal resistance through the liquid layer. The operation of the micro surface fissures or capillaries is discussed further below.

A nucleation surface is generally a roughened surface. The surface may be formed by sandblasting, laser etching or other technique that leaves a rough surface or a surface with small pockets in it.

Figure 36:
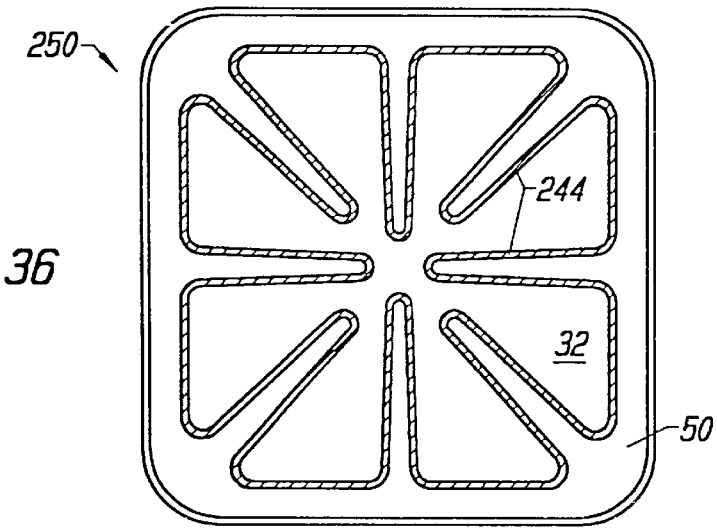
FIG. 36 is a plan view of an embodiment of the invention which includes perimeter nucleation site surfaces throughout the capillary fluid path.
Figure 37:
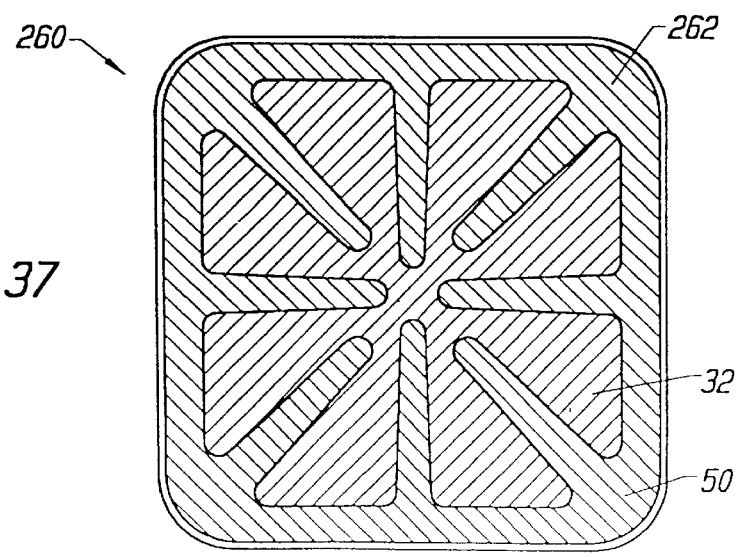
FIG. 37 is a plan view of an embodiment of the invention which includes nucleation site surfaces over capillary regions and non-capillary regions.

FIG. 36 illustrates a device 250 with a treated surface along all of the capillary fluid path surfaces 50. The device 260 of FIG. 37 illustrates that both the non-capillary region 32 and the entire fluid capillary path 50 may be formed with a treated surface 262.

Figure 38:
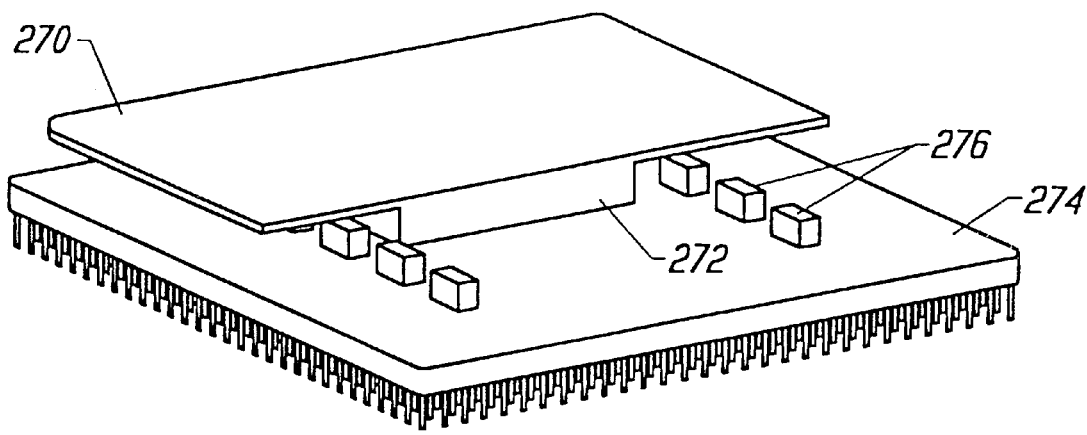
FIG. 38 is a perspective view of an embodiment of the invention with a pedestal member used to provide clearance over capacitors formed on the top of a semiconductor package.

FIG. 38 is a perspective view of another embodiment of the invention. The device 270 of FIG. 38 has a pedestal 272 so that the remaining portion of the heat spreader 270 clears any objects adjacent to a heat generating surface. For example, the semiconductor package 274 includes a set of on-board capacitors 276. Thus, the pedestal 272 is used to clear the on-board capacitors 276. Preferably, the pedestal 272 is integrally formed with the remaining portion of the device 270. The pedestal 272 may be solid metal.

Figure 39:
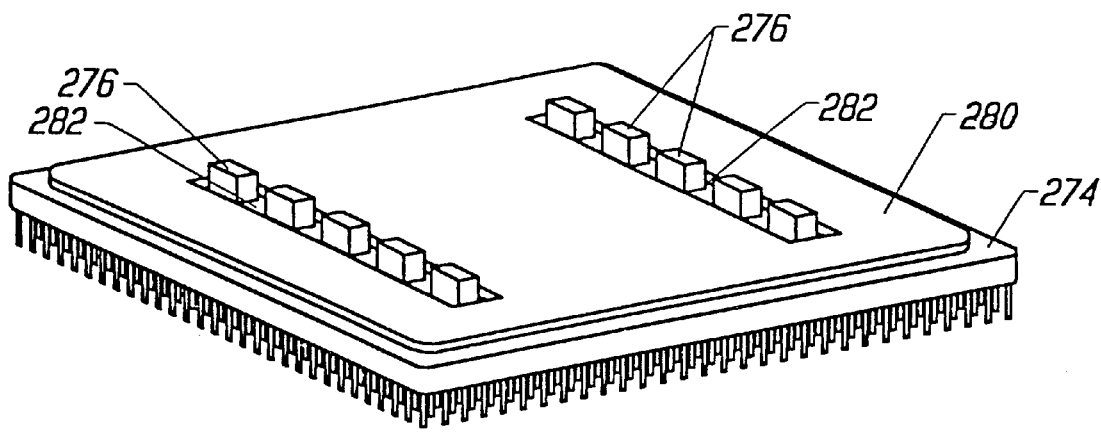
FIG. 39 is a perspective view of an embodiment of the invention with apertures to provide clearance for capacitors formed on the top of a semiconductor package.

FIG. 39 is a perspective view of another embodiment of the invention. In this embodiment, the heat spreader 280 is punctured with apertures 282. The apertures 282 allow protruding devices, such as on-board capacitors 276 of the semiconductor package 274, to extend through the heat spreader 280.

Figure 40:
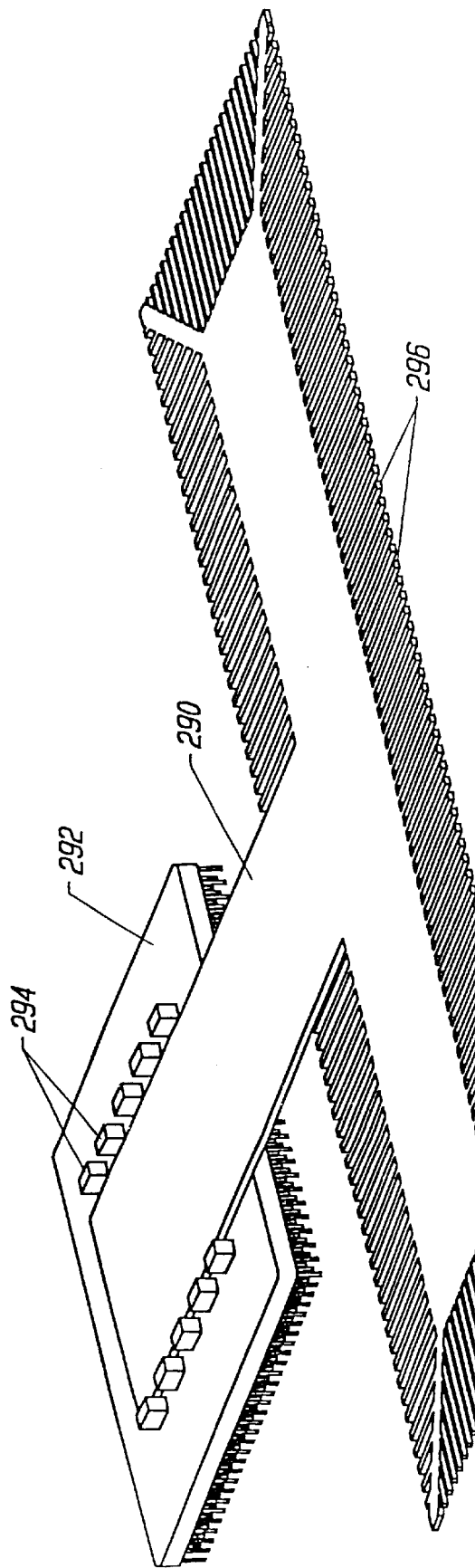
FIG. 40 is a perspective view of an embodiment of the invention wherein the apparatus includes an extended surface area and planar heat sink fins formed integrally within the plane defined by the apparatus.

FIG. 40 is a perspective view of a heat spreader 290 formed in accordance with another embodiment of the invention. The heat spreader 290 is positioned on semiconductor package 292, which includes on-board capacitors 294. The heat spreader 290 extends from the surface of the semiconductor package 292 into a cooling region. For example, if the semiconductor package 292 is positioned in a lap top computer, then the heat spreader 290 may extend beyond the semiconductor package 292 underneath the keyboard of the lap top computer. The interior portion of the heat spreader 290 includes a capillary fluid path and non-capillary regions as described above. The heat spreader 290 also includes heat fins 296. Preferably, the heat fins are not part of the interior portion of the heat spreader 290; that is, they do not have fluid circulating in them. Observe that the heat fins 296 are formed in the same plane as the heat spreader 290. This configuration is in contrast to prior art devices where the heat fins are orthogonal to the heat spreading surface.

Figure 41:
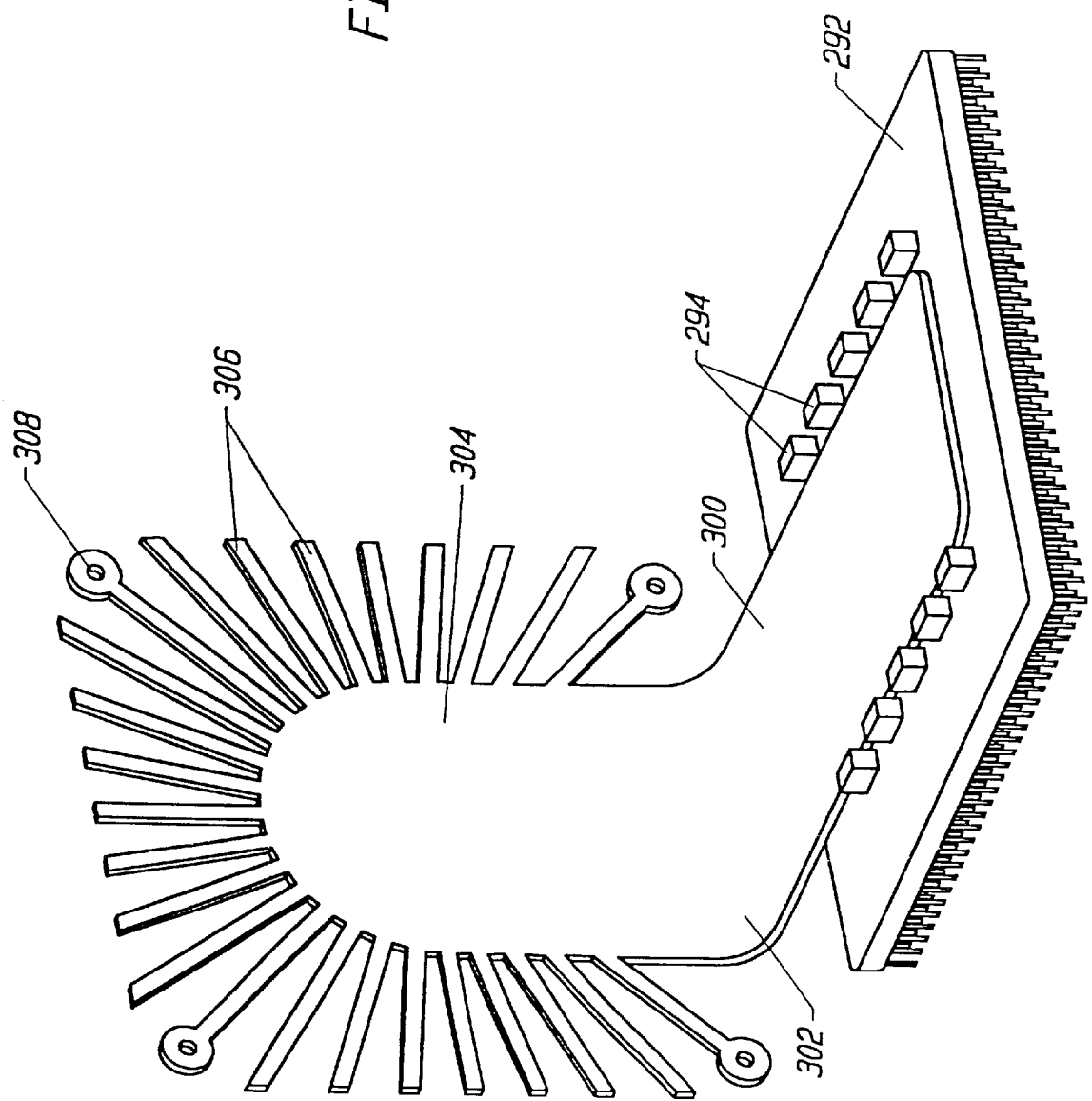
FIG. 41 is a perspective view of an embodiment of the invention wherein the apparatus includes a curved body and planar heat sink fins formed integrally within the plane defined by the apparatus.

FIG. 41 is a perspective view of a heat spreader 300 formed in accordance with another embodiment of the invention. As in the previous embodiment, the heat spreader 300 is positioned on a semiconductor package 292, which includes on-board capacitors 294. The heat spreader 300 includes a curved or bent region 302, which terminates in an orthogonal surface 304. Fluid circulates in capillary fluid path and non-capillary regions of the device 300. In particular, fluid continuously circulates from the horizontal region of the device 300, through the bend 302, and through the orthogonal surface 304. The device 300 also includes heat fins 306. Selected heat fins 306 include apertures 308, which may be used to attach a fan (not shown) to the orthogonal surface 304.

Observe that in each embodiment of the invention, the planar capillary fluid path is a continuous surface. That is, it is continuous in the sense that the fluid can move over the entire surface. In other words, fluid can move from any region on the surface to any other region on the surface.

Another noteworthy aspect of the invention is that most embodiments result in a substantially square apparatus. As used herein, the term substantially square refers to a length-to-width ratio of approximately 20:1, more preferably of approximately 2:1, and most preferably of approximately 1:1. Most prior art heat pipes and thermosiphons are configured as tubes.

The invention is unique in that the capillary fluid movement is established by a planar capillary defined in two adjacent horizontal planes. In prior art heat pipes, capillary fluid movement is typically established through grooves formed in a surface. In other words, small vertical walls are formed in a horizontal surface to establish capillary fluid movement. Vertical surfaces are not used in the present invention to establish capillary fluid movement. Instead, capillary fluid movement is established by the top (ceiling) and bottom (floor) surfaces of the planar capillary path.

The following table compares the heat spreading ability of various solid materials with that of the embodiment of the invention shown in FIG. 17.

TABLE I

| Material Performance | Weight (Grams) | Thermal Conductivity (W/m/K) | Thermal Resistance (° C./W) | Factor |
| --- | --- | --- | --- | --- |
| Copper/Tungsten (13/87) | 81.0 | 210 | 0.882 | 1.0 |
| Molybdenum (99.9%) | 50.5 | 146 | 1.268 | 0.70 |
| Aluminum 6061 | 13.4 | 180 | 1.028 | 0.86 |
| Gold (99.9%) | 95.2 | 317 | 0.584 | 1.51 |
| Copper (OFHC) | 44.1 | 391 | 0.473 | 1.86 |
| Silver (99.9%) | 51.8 | 429 | 0.432 | 2.04 |
| Diamond (I.a.) | 17.4 | 1,850 | 0.100 | 8.82 |
| Invention | 39.8 | 4,512 | 0.041 | 21.51 |

The performance factor is normalized with respect to copper/tungsten. All heat spreaders measure 71.0 mm×71.0 mm×1.0 mm. All heat spreaders had a 19.0 mm×19.0 mm square heat source centered on one side, and a 7.0 mm wide finned heat sink around the perimeter of the opposing side. The invention was implemented with molybdenum and included a non-capillary region with a depth of 1.0 mm and a capillary path with a depth of 0.125 mm. The device was charged with 0.329 cc of water. In general, the apparatus of the invention should be charged to an overfill condition of approximately 20%. That is, the liquid that does not fit in the fluid capillary path when the fluid capillary path is filled should constitute approximately 20% of the total liquid within the device. In general, the invention is implemented by using 0.007 cc of fluid per $cm^2$ of surface area of the device.

The outstanding thermal conductivity characteristics of the apparatus of the invention allows the invention to be implemented in a variety of materials. In other words, since a large percentage of the thermal conductivity performance is attributable to the heat of vaporization, the particular material used to implement the invention is not as crucial from a thermal conductivity standpoint. Instead, the material may be selected on the basis of cost, coefficient of thermal expansion, or other factors. One low cost implementation of the invention is in plastic, provided a hermetic seal is supplied.

The fluid within the planar capillary fluid path moves very quickly during steady state operation. Typically, the fluid moves at a speed of between 25 and 200 mm/s. This speed is dramatically faster than any device that uses a wick. This characteristic of the invention is partly responsible for the outstanding thermal distribution performance.

The performance of the apparatus of the invention is primarily a function of six parameters: vessel material, working fluid, adiabatic cross sectional area, planar capillary design, nucleation sites, and high aspect ratio micro surface capillaries. Each of these parameters has a broad range of values and costs. Consequently, the apparatus of the invention can be manufactured with an extensive price-performance spectrum. Attention now turns to a discussion of engineering trade-offs to be considered when constructing the device of the invention.

The selection of the vessel material depends upon material properties of thermal conductivity, coefficient of thermal expansion, density, and the tensile and compressive moduli. Thermal conductivity is inversely proportional to the vessel wall resistance. This wall resistance is in series with the working fluid (core) resistance. The importance of the vessel wall resistance increases as the core resistance decreases. For instance, if the core resistance is 0.001 degree Celsius per watt, and the wall resistance is 1.000 degree Celsius per watt, the total device resistance would be 1.001 degree Celsius per watt. Obviously, there will be little or no impact in the overall resistance by improving the core resistance, whereas increasing the thermal conductivity of the vessel wall will have a large impact on thermal performance.

The coefficient of thermal expansion (CTE) has little effect on the performance of the device of the invention. However, the heat source and heat sink can be very sensitive to the CTE of the apparatus of the invention. When interfacing two dissimilar materials, the CTE mismatch should be kept to a minimum, especially for large rigid interfaces.

The density of the material selected is usually very important in small portable devices like laptop computers, which always endeavor to reduce total weight. Another important consideration is the maximum mass that can be attached to components on a circuit board. A large mass attached to a component can cause cracks in the solder interface between the component and the circuit board, and cracks in the fine traces used in high density multi layer circuit boards.

The tensile and compressive moduli are important properties of the apparatus of the invention, since the interior pressure is a function of the working fluid and temperature. With water as the working fluid, and the vessel at zero degrees Celsius, the interior pressure is 4.6 torr, at 100 degrees Celsius it is 760 torr (equal to ambient sea level), and at 200 degrees Celsius it is 11,650 torr. This pressure differential causes the vessel walls to deflect. This deflection can cause heat source and heat sink interface problems, vessel stress cracking, and planar capillary geometry changes. With proper designs, absolute deflection over a reasonable temperature range is sub-micron.

Having completed a discussion of vessel material considerations, attention now turns to working fluid considerations. The working fluid must be compatible with the interior of the device surface and the vessel's sealing material, but not necessarily the bulk of the vessel material. The most common working fluids are acetone, ammonia, cesium, dowtherm, ethane, ethanol, freon (11, 113, 21, 22), helium, heptane, lead, lithium, mercury, methanol, nitrogen, potassium, rubidium, silver, sodium, and water. Water has the highest figure of merit (18 times ammonia at 100 degrees Celsius) in the zero to 200 Celsius range, and is low cost and non-toxic. Therefore, it is the preferred working fluid.

Unfortunately, water is one of nature's best solvents, and only a few non-precious metals, such as copper, molybdenum, nickel, chromium, and high nickel or chromium alloys are compatible with water. Incompatibility leads to corrosion and non-condensible gas formation-inside the vessel, which degrades the performance, sometimes dramatically.

The most preferred metals for heat transfer applications, specifically semiconductor applications, are aluminum (light weight) and iron alloys (CTE match to silicon). Unfortunately, these metals are not compatible with water. Keeping in mind that only the interior surface of the device needs to be compatible with the working fluid, coating these preferred metals is a solution. For instance, Kovar (FeNiCo 53/29/17) is not compatible with water in the presence of oxygen, and since it is nearly impossible to eliminate oxygen from the interior of the device, it is deemed incompatible. Applicant has identified a method of rendering the interior surface of a Kovar vessel inert to water. The process involves intentionally forming higher state oxides. In theory, if the next highest order oxide, from that which can be formed during typical vessel operation, is formed on the surface, oxygen can no longer react with the surface. Devices of the invention made with Kovar and charged with water will result in $Fe_2O_3$ covering the entire interior surface within a few hours, rendering the device useless. The next highest order oxide state from $Fe_2O_3$ is $Fe_3O_4$. The $Fe_3O_4$ layer appears to be inert to water in short term (1,000 hours) tests. This technique should be applicable to nearly any metal.

Another important design consideration is the adiabatic cross-sectional area. As the power density applied to the device of the invention increases, the local vapor velocity proportionately increases, thus the local pressure increases. Since the vapor pressure drop is a function of velocity squared, and the vapor temperature is related to vapor pressure, the adiabatic cross-sectional area should be sufficient to provide low velocity vapor flow.

Consider a 0.5 mm high adiabatic region with a 25 watt load and a water vapor temperature at the condenser region of 30 degrees Celsius. In such a device, the condenser pressure will be 31.8 torr. If the water vapor temperature at the evaporator region is 40 degrees Celsius, the evaporator pressure will be 55.4 torr, resulting in a temperature difference of 10 degrees Celsius and a pressure differential of 23.6 torr. If the power is increased to 200 watts (a factor of 8), the vapor velocity will also increase by a factor of 8, and the vapor pressure differential will be increased to 1,510.4 torr (23.6 times 8 squared). Assuming the condenser region remains at 30 degrees Celsius, the vapor pressure would then be 1542.2 torr (1,510.4+31.8), resulting in an evaporator vapor temperature of 121.1 degrees Celsius. That is a nine-fold temperature increase for an eight-fold power increase.

However, if the adiabatic region increased from 0.5 mm to 2.0 mm, the same design at 200 watts would result in a vapor pressure differential of 94.4 torr (23.6 times 2 squared), an evaporator vapor pressure of 126.2 torr (94.4+31.8), and an evaporator vapor temperature of 56.4 degrees Celsius. That is a 3.5-fold performance gain from simply increasing the design height by 1.5 mm.

Figure 42:
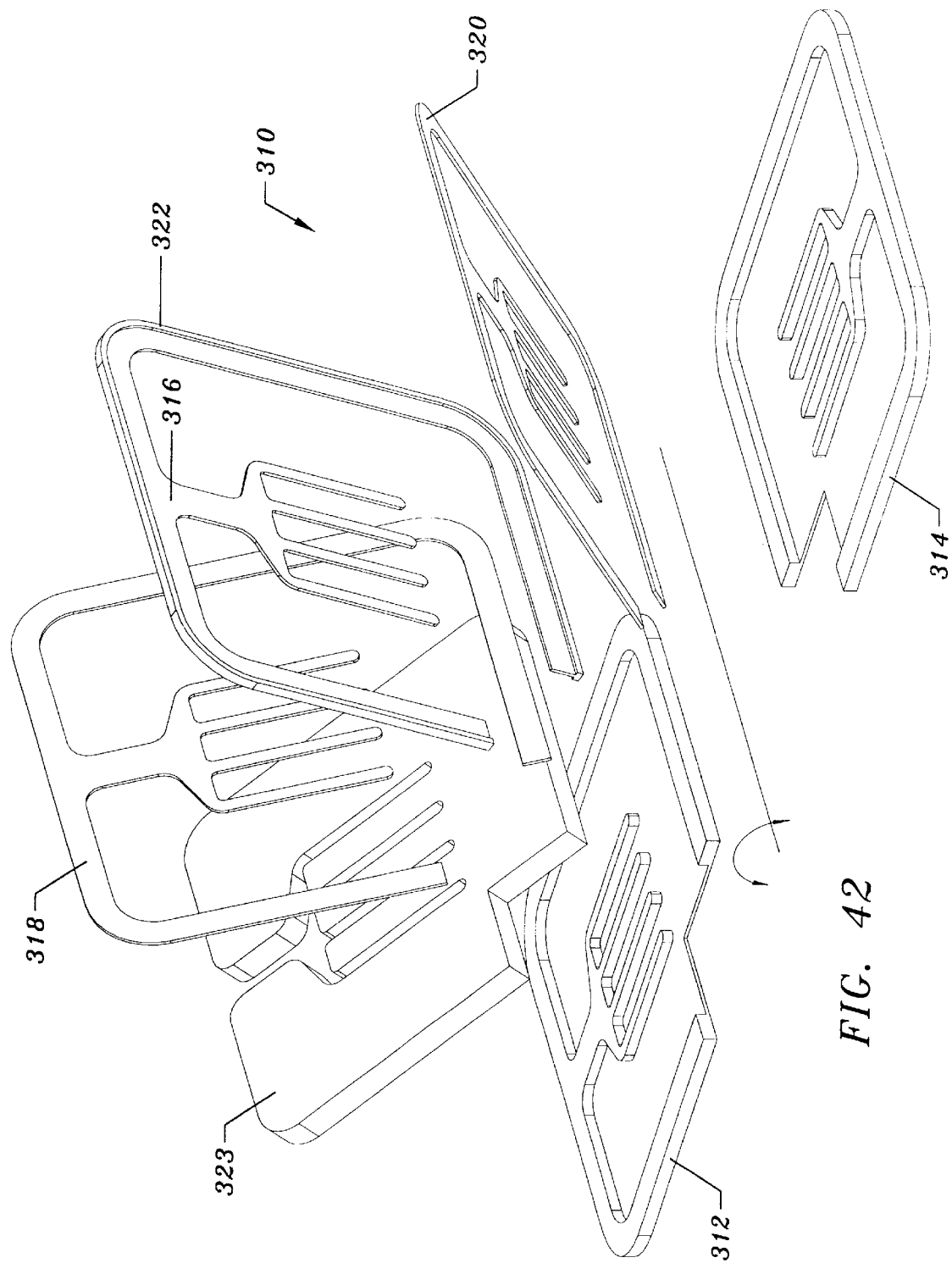
FIG. 42 is an exploded view of a heat spreader with multiple fluid capillary paths in accordance with an alternate embodiment of the invention.

The planar capillary design of the invention is also a critical parameter. To improve performance, additional planar capillaries may be provided. By way of example, FIG. 42 is an exploded view of a heat spreader 310 with multiple capillary paths. The heat spreader 310 includes a heat spreader top 312 and a heat spreader bottom 314. A capillary path template 316 is sandwiched between the heat spreader top 312 and the heat spreader bottom 314. This configuration results in a first capillary fluid path 318 and a second capillary fluid path 320. As discussed below, the capillary path template 316 has fluid vias to allow fluid communication between the first capillary fluid path 318 and the second capillary fluid path 320. FIG. 42 also illustrates a spacial region 323 representing the shape of the non-capillary region. Naturally, additional capillary path templates may be used if additional capillary paths are desired.

The embodiment of FIG. 42 is advantageous because it provides additional capillary routing for fluid transport. The embodiment of FIG. 42 is also advantageous because it facilitates simplified fabrication of the heat spreader top 312 and heat spreader bottom 314. Prior embodiments of the invention include a perimeter ridge along the fluid capillary path defined by the heat spreader top or bottom. An additional etching step is required to fabricate the perimeter ridge on the heat spreader top or bottom. Observe in FIG. 42 that the capillary path template 316 includes a perimeter ridge 322. The perimeter ridge provides spacial clearance to define the first fluid capillary path 318 and the second fluid capillary path 320. Thus, only the capillary path template 316, not the heat spreader top or bottom, needs to be fabricated with a ridge in this embodiment of the invention. Naturally, the invention may also be implemented with a capillary path template 316 which does not include a ridge. Observe in FIG. 42 that the capillary path template 316 has the same geometry as the capillary path defined by the heat spreader top 312 and the heat spreader bottom 314. In alternate embodiments of the invention, the capillary path template has a different geometry than the heat spreader top 312 and/or the heat spreader bottom 314.

Figure 43:
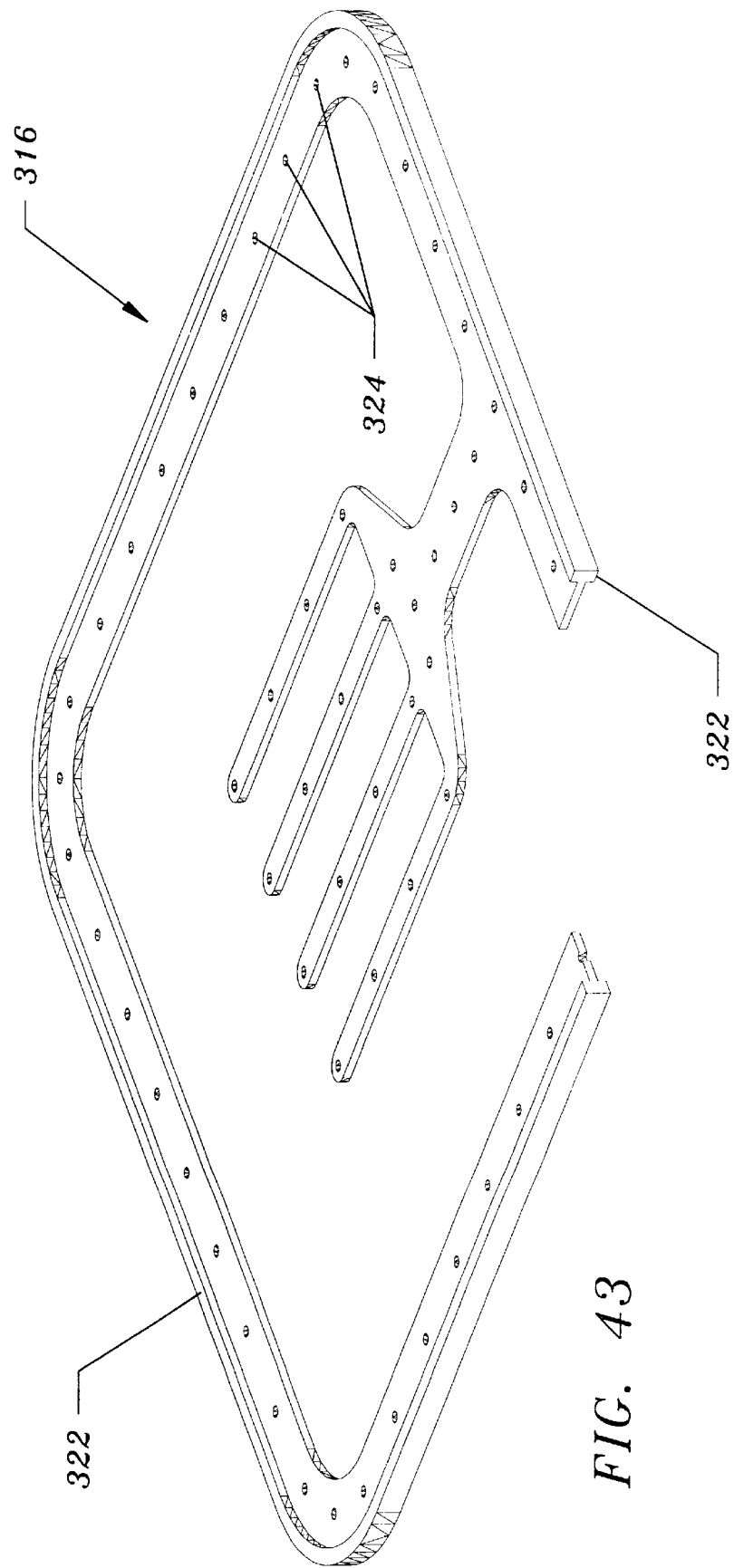
FIG. 43 is an enlarged perspective view of a fluid capillary template in accordance with an embodiment of the invention.

FIG. 43 provides a more detailed view of the capillary path template 316. In particular, the figure illustrates the nature of the perimeter ridge 322, which may be implemented with a "T" cross-section. The figure also illustrates fluid vias 324 to provide fluid communication between the capillary fluid paths. The fluid vias 324 were installed into the solid capillary path template 316. Alternately, a porous material may be used as the capillary path template.

Figure 44:
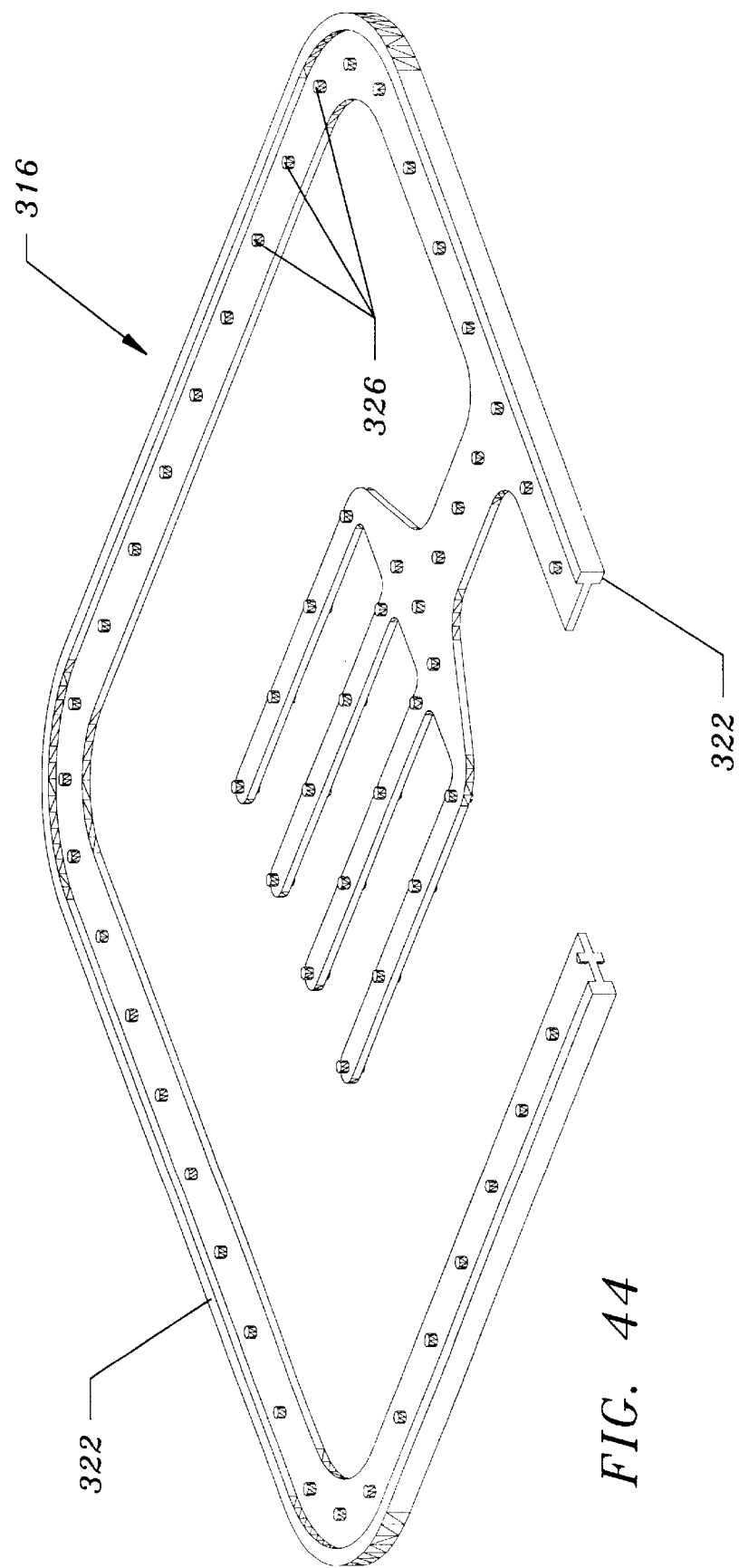
FIG. 44 is an enlarged perspective view of a fluid capillary template in accordance with an embodiment of the invention.
Figure 45:
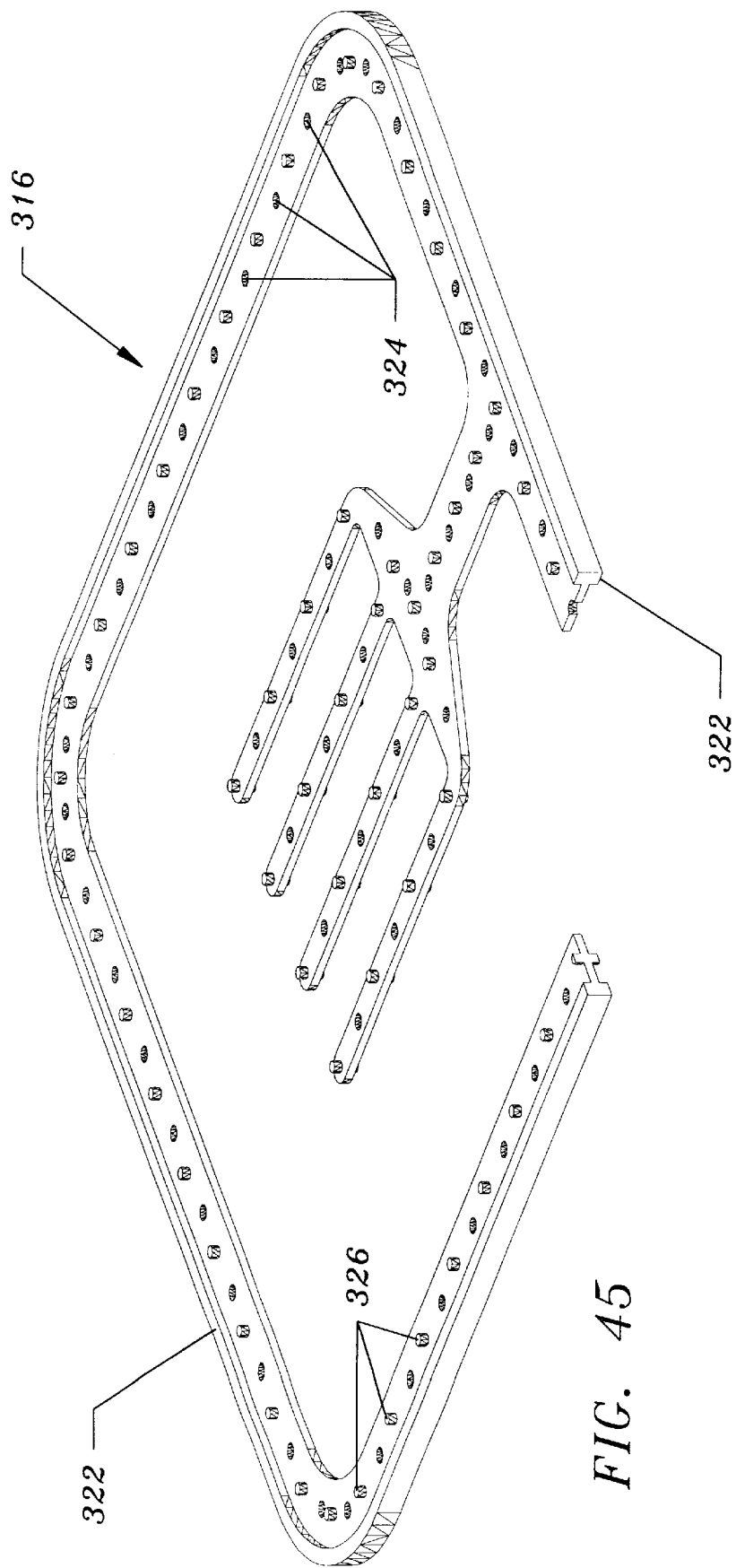
FIG. 45 is an enlarged perspective view of a fluid capillary template in accordance with an embodiment of the invention.

FIG. 44 provides a detailed view of a capillary path template 316 with support pillars 326. As previously discussed, in preferred embodiments of the invention, the interior chamber of the heat spreader is at extremely low pressure or vacuum. Therefore, the heat spreader is susceptible to deformation from external pressure. The support pillars 326 operate to prevent deformation. In addition, the support pillars 326 maintain a uniform vertical clearance for the capillary path. Further, the support pillars 326 operate as heat transfer pillars. FIG. 45 illustrates the capillary path template 316 with both fluid vias 324 and support pillars 326.

Returning to the discussion of heat spreader design considerations, nucleation sites can also improve device performance. Although liquid can undergo the liquid-vapor phase change without boiling, the increased agitation associated with boiling can increase the surface area heat transfer coefficient. Therefore, in order to promote boiling, nucleation sites can be formed on the surface. A nucleation site is a cavity, or void, where liquid can wet the walls of the void, but where liquid will not fill the void while vapor is being expelled from the opening to the void. This void usually has an opening which is smaller than the interior diameter, however, high aspect ratio (>3:1) straight walled holes work as well. Regardless of the exact geometry, nucleation sites have the same basic geometry, 1 to 15 microns in diameter (depending on the working fluid) with a depth to diameter ratio of at least 3:1.

Figure 46:
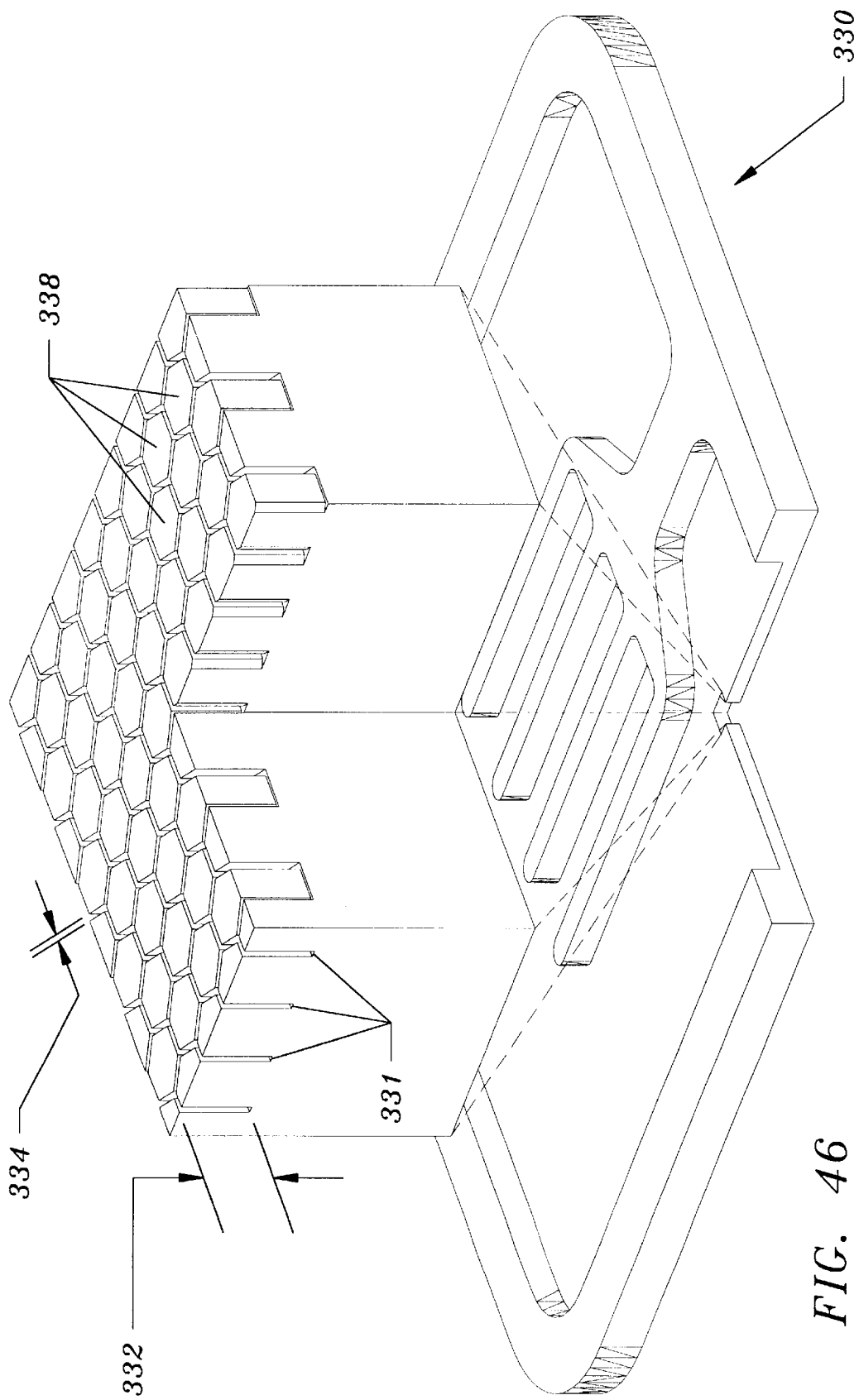
FIG. 46 is an enlarged view of high aspect ratio micro surface capillaries constructed in accordance with an embodiment of the invention.

A final design consideration associated with the apparatus of the invention is the high aspect ratio micro surface fissures or capillaries associated with preferred embodiments of the invention. FIG. 46 illustrates a heat spreader 330 in accordance with an embodiment of the invention. The figure also provides an enlarged view of a portion of the treated surface of the heat spreader. The enlarged view demonstrates high aspect ratio micro surface capillaries 331 that are used in preferred embodiments of the invention. The term high aspect ratio refers to a capillary depth (as shown with arrow 332) to a capillary width (marked 334) ratio of at least 1:1. Preferably, the aspect ratio is at least 3:1, more preferably, the aspect ratio is approximately 10:1. The term micro surface capillary refers to a capillary structure defining a width that is less than 200 microns.

These high aspect ratio micro surface capillaries are formed from the intergranular and intragranular boundaries found in nearly all materials. These intergranular and intragranular boundaries are randomly formed. They look relatively unfirom in FIG. 46 simply for the purpose of illustration. These boundaries encompass each grain 338. During normal fabrication these grains are not visible, however, with proper treatment they are exposed. Once exposed, various processes can render the boundaries susceptible to chemical attack. This intergranular chemical attack, as the name implies, selectively etches the boundaries, leaving the grains intact. The capillaries that are formed have extremely rough walls, undercuts, nucleation sites, and very high surface area, attributes of a superior micro surface capillary. The capillary width, depth, and resolution are easily controlled by the grain size and magnitude of chemical etch. Grain size is controlled by various heat treatment methods and can range from a few microns to hundreds of microns.

By way of example, the following processing was performed to create high aspect ratio micro surface capillaries. Different Kovar heat spreaders configured in accordance with the invention were oxidized at between 500 and 800° C. for fifteen minutes to ten hours, depending upon the desired aspect ratio. The parts were then emersed in 38% hydrochloric acid at 80° C. Preferably, they were ultrasonically agitated for fifteen to seventy five minutes while in the hydrochloric acid bath. The parts were then removed and rinsed. The process was repeated to achieve a desired high aspect ratio micro surface capillary geometry.

Observe that these etching techniques allow the high aspect ratio micro surface capillaries to be uniformly formed on both horizontal and vertical surfaces of the heat spreader. That is, since a wet chemical process is involved, any exposed surface of the device is etched. While the high aspect ratio micro surface capillaries are uniformly formed on both horizontal and vertical surfaces, the capillaries themselves are randomly formed. As previously indicated, the capillaries are randomly formed because they correspond to the intergranular and intragranular grain boundaries. This being the case, each heat spreader will have a unique high aspect ratio micro surface capillary architecture. High aspect ratio micro surface capillaries of this type stand in contrast to capillaries formed by any other technique, including mechanical, photolithographic, and energy beam techniques.

Mechanical techniques are limited to gross (not micro) geometries on horizontal surfaces. Photolithographic processes can produce finer geometries, but are also limited to low aspect ratios (<1.1) and horizontal surfaces. Energy beam methods can produce fine geometries, high aspect ratios (3:1), but are also limited to horizontal surfaces, and are cost prohibitive.

There are a number of benefits associated with the high aspect ratio micro surface capillaries of the invention. The hydraulic diameter of the micro surface capillaries can be smaller than the hydraulic diameter of the planar capillary fluid paths of the invention. If so, the micro surface capillaries have a greater velocity potential than the planar capillary fluid paths. The high aspect ratio micro surface capillaries also operate as extended surfaces for improved heat transfer. In addition, the high aspect ratio micro surface capillaries provide enhanced wicking action between the condenser region and the planar capillary fluid path.

The high aspect ratio micro surface capillaries also provide improved wetting. A liquid can wet a solid if the surface energy of the liquid is lower than the surface energy of the solid. The greater the difference in surface energy, the greater the wetting, and the greater the wetting the lower the wetting angle. A higher wetting value results in greater capillary pressure. The surface energy of clean metals is much greater than the surface energy of typical working fluids. The micro surface capillaries further reduce the near zero wetting angle of the clean planar capillary to increase the planar capillary pressure, which increases the flow capacity.

The high aspect ratio micro surface capillaries also reduce hydrodynamic friction and countercurrent entrainment. That is, vapor flowing adjacent to a liquid can cause the liquid to migrate in the direction of the vapor flow. This migration is known as entrainment. The liquid layer closest to the vapor flow is most effected. Therefore, deeper liquid layers in high aspect ratio micro surface capillaries are less effected.

Figure 47:
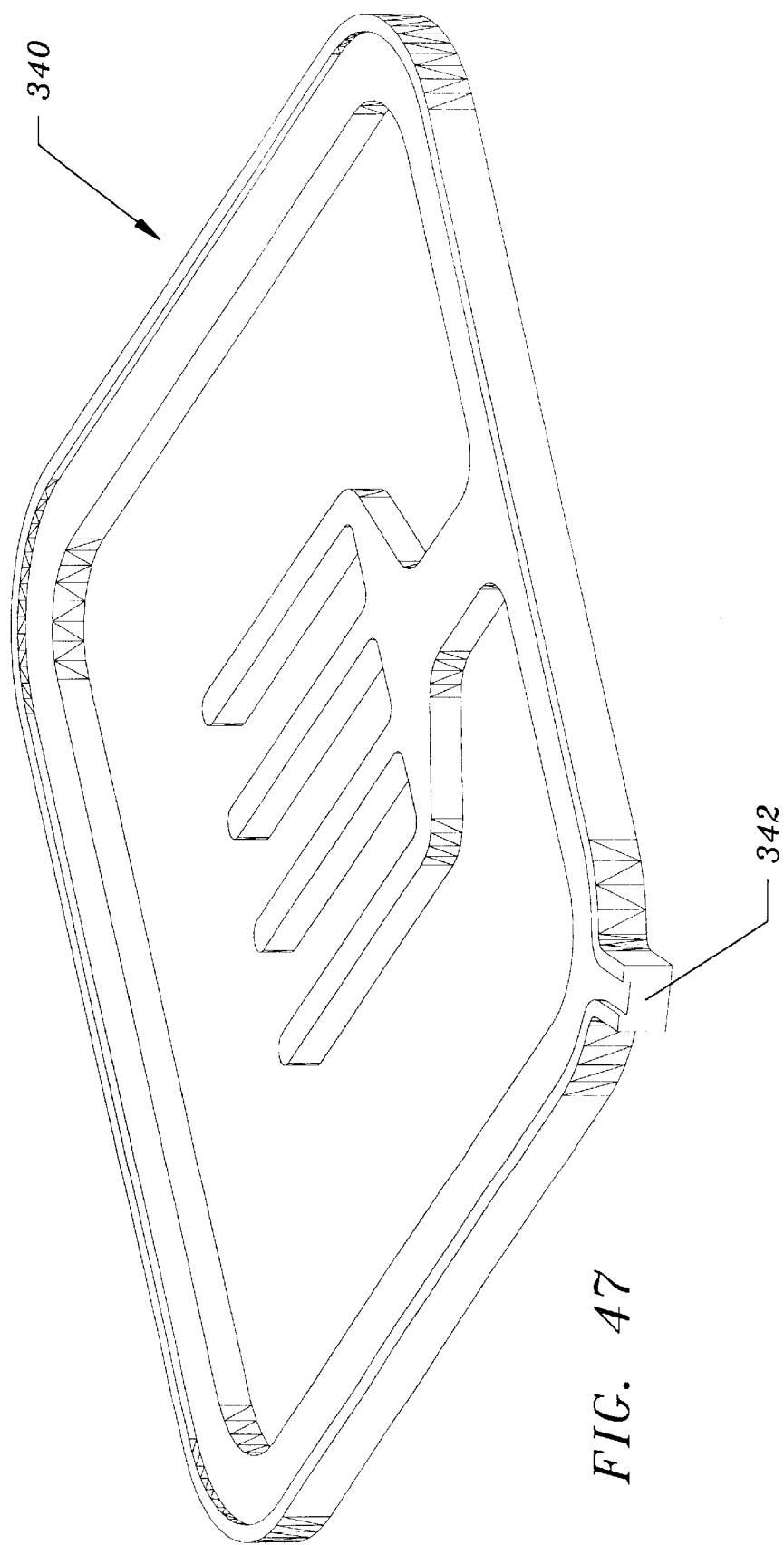
FIG. 47 illustrates a fluid charging channel used in accordance with an embodiment of the invention.

FIG. 47 illustrates a heat spreader 340 with a fluid charging channel 342. The fluid charging channel 342 provides a path for fluid to enter the heat spreader during assembly. During assembly, a matching top piece (not shown) is positioned over the heat spreader 340. After the interior chamber is evacuated, as previously discussed, fluid is loaded into the interior chamber via the fluid charging channel 342. The fluid charging channel 342 may be sealed with the matching top piece (not shown) by mechanical pinching.

Figure 48:
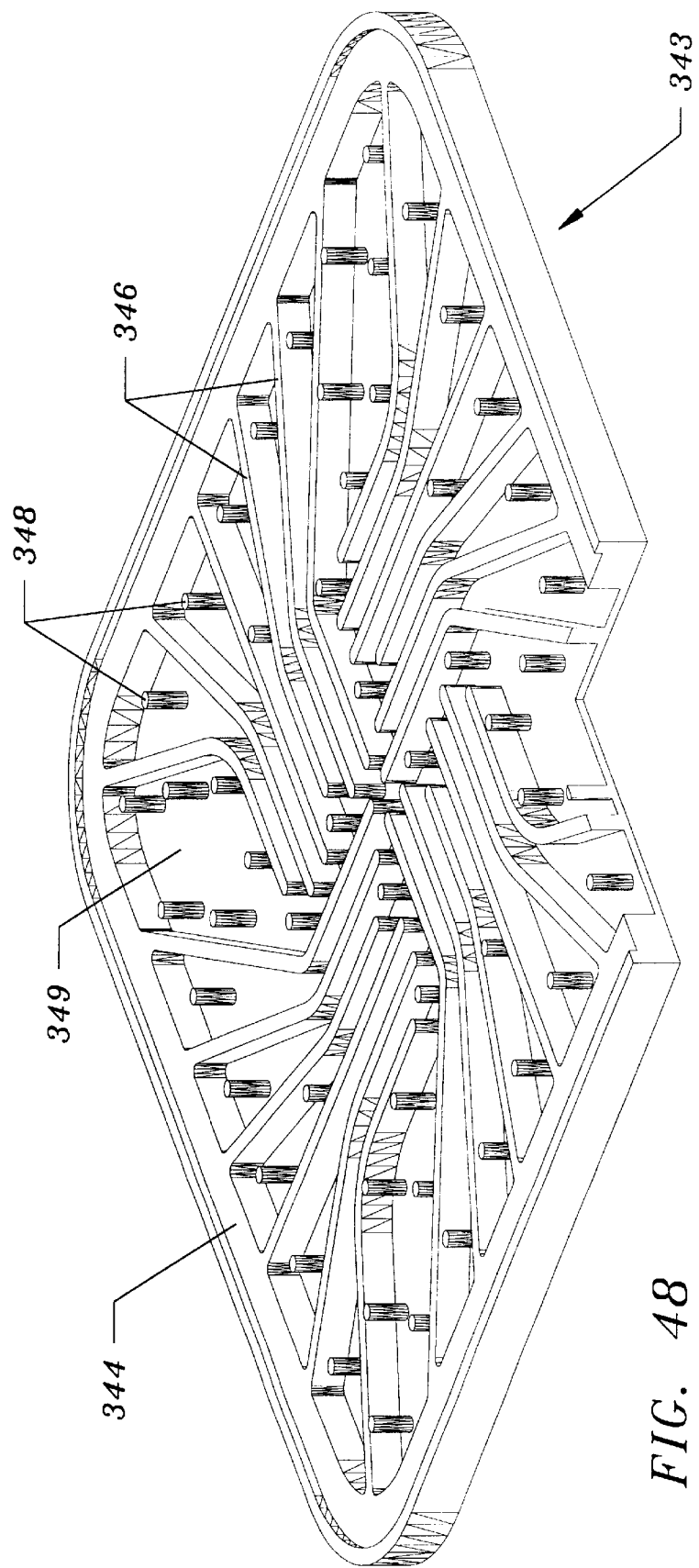
FIG. 48 illustrates an alternate heat spreader apparatus of the invention.

FIG. 48 illustrates a heat spreader 342 in accordance with yet another embodiment of the invention. As with previous embodiments, the heat spreader 342 includes a perimeter fluid capillary path 344, which extends into a fluid capillary path leg 346. FIG. 48 also illustrates heat transfer pillars 348. Observe in FIG. 48 that the fluid capillary path 344 has a relatively large vertical axis. In other words, it steeply rises from the surface 349. Despite this relatively large vertical axis, fluid still wicks into the fluid capillary path 344 via the high aspect ratio micro surface capillaries. When the fluid is returned via the fluid capillary path 344 to the evaporator region at the center of the device, the high aspect ratio micro surface capillaries promote vaporization.

Figure 49:
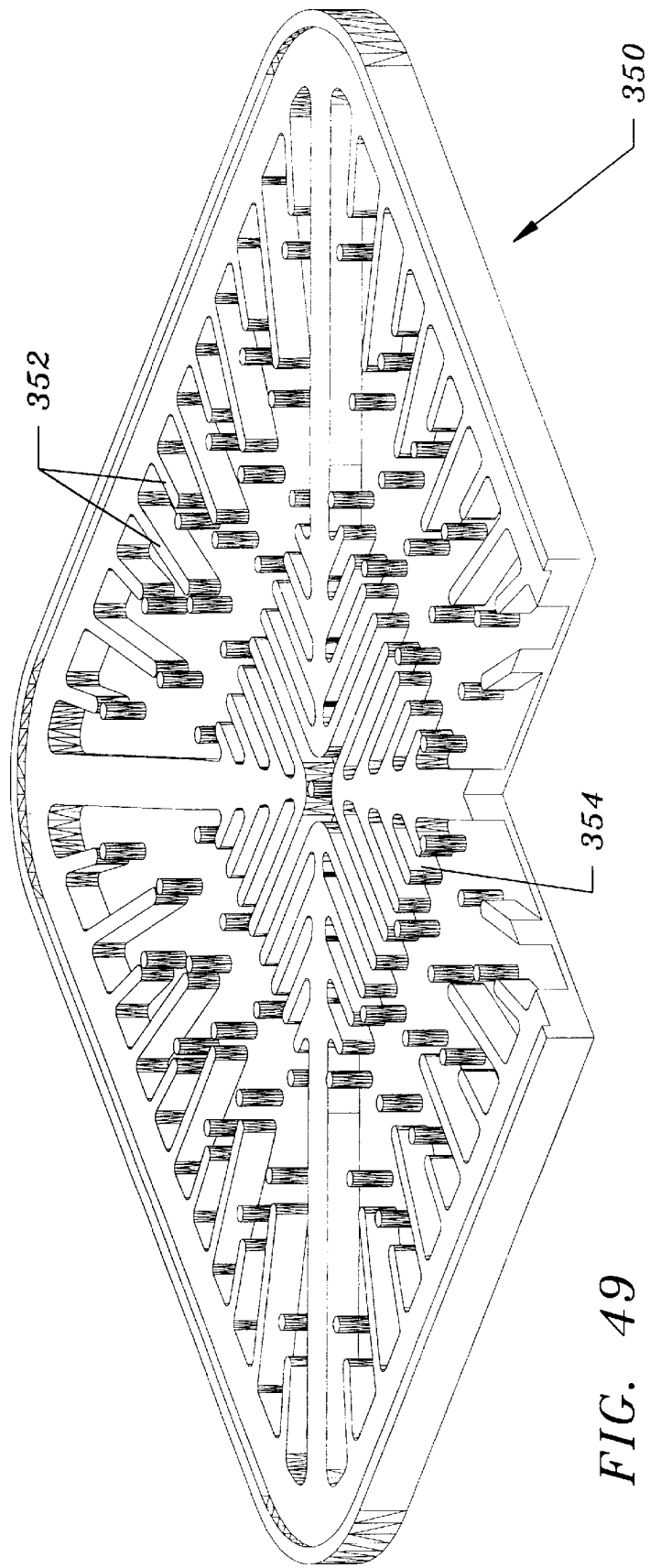
FIG. 49 illustrates an alternate heat spreader apparatus of the invention.

FIG. 49 illustrates another heat spreader 350 in accordance with the invention. The design of heat spreader 350 provides another example of extended surfaces. That is, the perimeter capillary path 352 includes extended surfaces, as does the interior capillary path 354 (evaporator region). Recall also that the high aspect ratio micro surface capillaries provide additional extended surfaces.

The embodiments of the present invention can be considered as having "interior heat fins". For example, the fluid capillary paths and heat transfer pillars within the body of the device are types of interior heat fins, analogous to external finned heat sinks. The interior heat fins of the invention provide a very high heat transfer coefficient, which is enhanced by the high aspect ratio micro surface capillaries.

Figure 50:
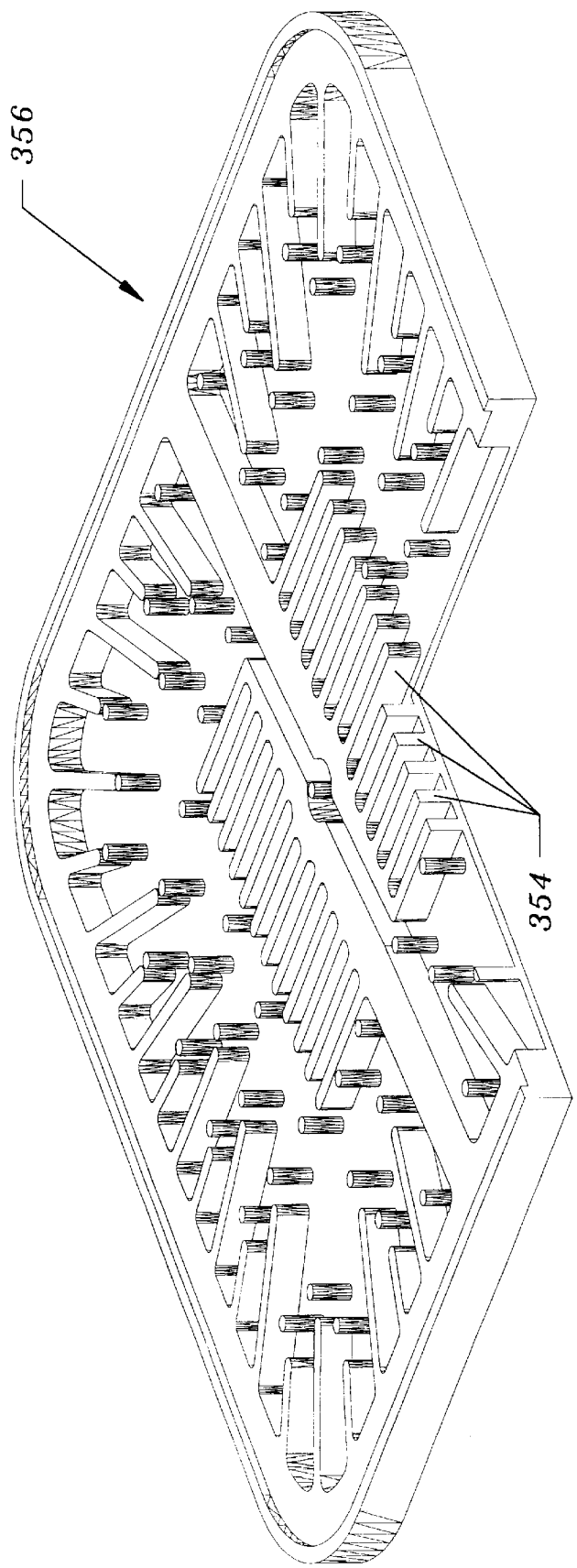
FIG. 50 illustrates an alternate heat spreader apparatus of the invention.

FIG. 50 illustrates another heat spreader 356 in accordance with the invention. The heat spreader 356 provides another example of concurrent flow. As previously discussed, concurrent flow is where both the liquid and vapor are moving in the same direction, as opposed to counter-current flow where the liquid and vapor are moving in opposite directions. When the liquid and vapor are counter-current, the flow of liquid is restricted. This restriction can inhibit the return of liquid to the evaporator, resulting in premature dryout. All other known heat pipes are limited to counter-current flow.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A heat spreading apparatus, comprising:
   a body with an interior surface defining a void, said interior surface including random micro surface capillaries chemically formed within said body to transport a condensed working fluid from a cool region to a hot region where said working fluid is evaporated, said random micro surface capillaries being formed within etched intergranular regions of said interior surface.

2. The heat spreading apparatus of claim 1 wherein said random micro surface capillaries have a depth to width ratio of at least 1:1.

3. The heat spreading apparatus of claim 1 wherein said random micro surface capillaries have a depth to width ratio of at least 3:1.

4. The heat spreading apparatus of claim 1 wherein said random micro surface capillaries have a depth to width ratio of approximately 10:1.

5. The heat spreading apparatus of claim 1 wherein said body defines an interior surface including a non-capillary region and a planar capillary region with a substantially rectangular cross-section, said planar capillary region adapted to transport a condensed fluid from a cool region of said void to a hot region of said void where said fluid is evaporated.

6. The heat spreading apparatus of claim 5 wherein said body defines an interior surface including a bottom planar capillary surface and a corresponding top planar capillary surface, said bottom planar capillary surface being vertically positioned with respect to said top planar capillary surface to produce capillarity therebetween.

7. The heat spreading apparatus of claim 6 wherein the vertical distance between said bottom planar capillary surface and said top planar capillary surface is less than 0.5 mm.

8. The heat spreading apparatus of claim 6 further comprising a capillary path template positioned between said top planar capillary surface and said bottom planar capillary surface, thereby forming a first capillary fluid path between said top planar capillary surface and said capillary path template, and a second capillary fluid path between said bottom planar capillary surface and said capillary path template.

9. The heat spreading apparatus of claim 8 wherein said capillary path template has fluid vias formed therein.

10. The heat spreading apparatus of claim 1 wherein said body has a fluid channel formed therein, said fluid channel being adapted to load a fluid into said void.

11. The heat spreading apparatus of claim 1 further comprising interior heat fins positioned within said void.

12. A method of constructing a heat spreader, said method comprising the steps of:
    emersing a first body portion within a chemical to produce chemically formed random micro surface capillaries within said first body portion, said random micro surface capillaries being formed within etched intergranular regions of said first body portion;
    attaching said first body portion to a second body portion to define a void between said first body portion and said second body portion;

loading a fluid into said void;

removing non-condensable gases from said void; and sealing said void.

13. The method of claim 12 wherein said emersing step includes the step of emersing said first body portion into a chemical that etches intergranular grain boundaries to produce said etched intergranular regions of said first body portion.

14. The method of claim 12 further comprising, prior to said attaching step, emersing said second body portion within said chemical to produce etched intergranular regions within said second body portion.

15. The method of claim 12 further comprising the steps of:

forming said first body portion with a first planar capillary surface and a first non-capillary surface; and forming said second body portion with a second planar capillary surface corresponding to said first planar capillary surface and a second non-capillary surface corresponding to said first non-capillary surface, such that after said attaching step, said first planar capillary surface and said second planar capillary surface define a planar capillary region and said first non-capillary surface and said second non-capillary surface define a non-capillary region.

16. The method of claim 12 wherein said attaching step includes the step of positioning a capillary path template between said first body portion and said second body portion.

17. The method of claim 12 wherein said emersing step is preceded by the step of oxidizing said first body portion.

18. The method of claim 12 wherein said emersing step includes the step of emersing said first body portion into an etchant.

19. The method of claim 18 further comprising the step of applying ultrasonic agitation during said emersing step.

20. The method of claim 12 wherein said loading step includes the step of loading said fluid through a fluid charging channel.

21. The method of claim 20 wherein said sealing step includes the step of mechanically pinching said fluid charging channel.

* * * * *